US012492470B2

(12) United States Patent
Zong

(10) Patent No.: US 12,492,470 B2
(45) Date of Patent: Dec. 9, 2025

(54) RAW MATERIAL GASIFICATION DEVICE, FILM COATING DEVICE, FILM COATING APPARATUS AND FEEDING METHOD THEREFOR

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 428 days.

(21) Appl. No.: 18/016,847

(22) PCT Filed: Jun. 25, 2021

(86) PCT No.: PCT/CN2021/102447
§ 371 (c)(1),
(2) Date: Jan. 18, 2023

(87) PCT Pub. No.: WO2022/022188
PCT Pub. Date: Feb. 3, 2022

(65) Prior Publication Data

US 2023/0349041 A1 Nov. 2, 2023

(30) Foreign Application Priority Data

Jul. 27, 2020 (CN) ........................ 202010729972.X
Jul. 27, 2020 (CN) ......................... 202010730603.2
(Continued)

(51) Int. Cl.
*C23C 16/452* (2006.01)
*C23C 16/455* (2006.01)
*C23C 16/513* (2006.01)

(52) U.S. Cl.
CPC ...... *C23C 16/452* (2013.01); *C23C 16/45561* (2013.01); *C23C 16/513* (2013.01)

(58) Field of Classification Search
CPC .............. C23C 16/4485; C23C 16/448; C23C 16/4482; C23C 16/4483; C23C 16/45561
See application file for complete search history.

(56) References Cited

U.S. PATENT DOCUMENTS 5,356,451 A * 10/1994 Cain .................... B01D 1/0011 65/17.4
6,179,277 B1 1/2001 Huston et al.
(Continued)

FOREIGN PATENT DOCUMENTS

CN 101689499 3/2010
CN 105716224 6/2016
(Continued)

OTHER PUBLICATIONS

Extended European Search Report issued in European Patent Application No. 21851416.4, dated Aug. 26, 2024.
(Continued)

*Primary Examiner* — Joseph A Miller, Jr.
(74) *Attorney, Agent, or Firm* — pH IP Law

(57) ABSTRACT

Disclosed in the present invention are a raw material gasification device, a film coating apparatus and a gasification method therefor. The raw material gasification device comprises: a first-stage gasification component, the first-stage gasification component being configured to perform primary gasification on fed raw materials; a second-stage gasification component, the second-stage gasification component being configured to perform further gasification on the raw materials subjected to the primary gasification by the first-stage gasification component; and a feeding control portion, the feeding control portion being configured to feed the raw materials to be gasified, and the feeding control portion
(Continued)

being in controlled communication with the first-stage gasification component, thereby increasing the gasification efficiency of the raw materials.

20 Claims, 18 Drawing Sheets

(30) Foreign Application Priority Data

Jul. 27, 2020 (CN) ......................... 202021509116.5
Jul. 27, 2020 (CN) ......................... 202021509120.1

(56) References Cited

U.S. PATENT DOCUMENTS

| | | | | |
|---|---|---|---|---|
| 2007/0199509 | A1* | 8/2007 | Moffatt | B05D 1/60 118/715 |
| 2011/0033618 | A1* | 2/2011 | Noll | C23C 16/45561 118/724 |
| 2011/0124201 | A1* | 5/2011 | Marsh | C23C 16/52 438/758 |
| 2012/0269985 | A1 | 10/2012 | Shyu et al. | |
| 2015/0279693 | A1 | 10/2015 | Jongbloed et al. | |
| 2015/0377481 | A1 | 12/2015 | Smith et al. | |
| 2016/0178187 | A1 | 6/2016 | Taguchi et al. | |
| 2017/0114445 | A1 | 4/2017 | Long | |
| 2018/0071702 | A1 | 3/2018 | Hidaka et al. | |
| 2019/0185990 | A1 | 6/2019 | Zhao | |
| 2020/0149162 | A1* | 5/2020 | Hidaka | B01D 1/0082 |

FOREIGN PATENT DOCUMENTS

| | | | |
|---|---|---|---|
| CN | 106119781 | | 11/2016 |
| CN | 206359604 | | 7/2017 |
| CN | 206502865 | | 9/2017 |
| CN | 206768209 | | 12/2017 |
| CN | 107964653 | | 4/2018 |
| CN | 108103450 | | 6/2018 |
| CN | 110965040 | | 4/2020 |
| CN | 110983300 | | 4/2020 |
| CN | 111945135 | | 11/2020 |
| CN | 111996501 | | 11/2020 |
| CN | 213417009 | | 6/2021 |
| JP | H09192405 | A | 7/1997 |
| JP | 2009088157 | A | 4/2009 |
| JP | 2016119478 | A | 6/2016 |
| TW | 531566 | B | 5/2003 |
| TW | 201544611 | | 12/2015 |
| TW | 201705279 | A | 2/2017 |

OTHER PUBLICATIONS

International Search Report and Written Opinion for PCT/CN2021/102447 dated Sep. 7, 2021.

English translation of an Office Action issued in Japanese Patent Application No. 2023-503491, dated Mar. 5, 2024.

* cited by examiner

B

C-C

RAW MATERIAL GASIFICATION DEVICE, FILM COATING DEVICE, FILM COATING APPARATUS AND FEEDING METHOD THEREFOR

CROSS REFERENCE TO RELATED APPLICATIONS

This application is a national phase application under 35 U.S.C. § 371 of International Application No. PCT/CN2021/102447, filed Jun. 25, 2021, which claims the priority of Chinese Patent application Ser. No. 20/201,0729972.X, filed with the China National Intellectual Property Administration on Jul. 27, 2020 and Chinese Patent Application No. 202010730603.2 filed with the China National Intellectual Property Administration on Jul. 27, 2020 and Chinese Patent Application No. 202021509116.5 filed with the China National Intellectual Property Administration on Jul. 27, 2020 and Chinese Patent Application No. 202021509120.1 filed with the China National Intellectual Property Administration on Jul. 27, 2020, each of which are hereby incorporated by reference in their entirety.

TECHNICAL FIELD

The present disclosure relates to the technical field of coating, and more particularly to a raw material gasification device, a secondary feeding evaporation device, a film coating device, a film coating apparatus and a feeding and gasification method thereof, wherein the raw material gasification device provides a steam raw material for the film coating device and the film coating apparatus.

BACKGROUND

Plasma coating technology is widely used in aerospace, automobile manufacturing, mechanical heavy industry, hardware tool manufacturing and many other fields because of its advantages such as good film quality. In recent years, with the rapid development of various electronic devices such as smart touch screen mobile phones, plasma coating technology has been gradually applied to the field of electronic devices, and has produced good results.

During plasma coating process, a liquid reaction raw material needs to be gasified through a gasification device and then conveyed to a coating device. For example, during the coating process, an internal chamber of the coating device is vacuumed, and the raw material gasified by the gasification device are sucked into the coating device through negative pressure, and then a film is formed on a surface of a substrate in the coating device by plasma vapor deposition, thus the degree of gasification may affect the effect of film deposition. Further, in the plasma coating process, air in a cavity of the coating device needs to be extracted to maintain a low pressure state, and at the same time, a chemical monomer gas is conveyed to the cavity of the coating device through a feeding device for reaction to form a polymer coating on a surface of a workpiece to be coated. A chemical monomer is usually liquid when stored at room temperature, but it needs to be gaseous when added into the cavity, thus the feeding device needs to have a heating and evaporation function so as to heat and evaporate the liquid chemical monomer into the chemical monomer gas during feeding process.

However, existing gasification device has following disadvantages:

First, the existing gasification device usually has a single gasification cavity. In the use process, the gasification efficiency of the single gasification cavity is extremely low, and insufficient gasification of a chemical raw material often occurs, which causes residual liquid chemical raw material or chemical raw material that are not fully gasified in the gasification cavity to be sucked into the coating device, resulting in uneven coating thickness and even coating failure.

Secondly, the liquid chemical raw material is directly heated and evaporated after entering the gasification device, thus the chemical raw material may be accumulated to cause insufficient gasification.

Thirdly, the chemical raw material in different states is gathered in the same evaporation chamber and heated for evaporation at one time, resulting in poor evaporation effect, that is, low gasification efficiency.

In addition, the existing feeding device is usually a single feeding evaporator. As shown in FIGS. 10A and 10B, a single feeding evaporator 1P includes a chamber body 10P, a pair of covers 20P, a feed pipe 30P, a discharge pipe 40P and a heating rod. The chamber body 10P has a pair of interconnected cavities 11P, and the pair of cavities 11P are relatively arranged on the left and right sides of the chamber body 10P to form a sealed evaporation chamber by correspondingly covering the pair of covers 20P. The feed pipe 30P is communicated with the evaporation chamber from an upper part of the chamber body 10P for conveying a chemical monomer liquid to the evaporation chamber. The heating rod is inserted from a rear side of the chamber body 10P to heat the chemical monomer liquid entering the evaporation chamber, causing the chemical monomer liquid to evaporate to form a chemical monomer gas. The discharge pipe 40P is communicated with the evaporation chamber from a front side of the chamber body 10P for conveying the chemical monomer gas to the cavity of the coating device.

However, before the chemical monomer liquid enters the evaporation chamber of the chamber body 10P of the single feeding evaporator 1P, the evaporation chamber will be filled with air. Therefore, the single feeding evaporator 1P will make the chemical monomer liquid evaporate in an air environment at an initial stage, which will affect the purity of the chemical monomer gas and cause the waste of the chemical monomer gas, and even the chemical monomer gas will introduce impurities due to the reaction with the air, which can seriously reduce the quality of the chemical monomer gas. Therefore, the subsequent coating process cannot be carried out normally, or the quality of subsequent coating can be seriously affected.

In addition, on the one hand, because the existing feeding device is only equipped with one feed pipe 30P, the control range of feeding flow of the chemical monomer liquid is narrow, and it is difficult to meet the demand of large feeding amount; on the other hand, the pair of covers 20P in the existing feeding device is disassembled from the left and right sides of the chamber body 10P respectively, and the discharge pipe 40P behind the chamber body 10P is communicated with the large chamber of the coating device, which makes it difficult to disassemble the pair of covers 20P because the pair of covers 20P are close to the chamber of the coating device (that is, the chamber of the coating device will affect the disassembly of the pair of covers 20P), which is not conducive to the subsequent cleaning and maintenance of the pair of cavities 11P of the chamber body 10P.

SUMMARY

One advantage of the present disclosure is to provide a raw material gasification device, a secondary feeding evaporation device, a film coating device, a film coating apparatus and a feeding and gasification method thereof, which can improve the gasification efficiency of a liquid chemical raw material by extending a gasification path.

Another advantage of the present disclosure is to provide a raw material gasification device, a secondary feeding evaporation device, a film coating device, a film coating apparatus and a feeding and gasification method thereof, which can extend the gasification path by a multi-stage gasification component.

Another advantage of the present disclosure is to provide a raw material gasification device, a secondary feeding evaporation device, a film coating device, a film coating apparatus and a feeding and gasification method thereof, wherein the raw material gasification device includes at least two gasification components, which are partially communicated with each other so that the two gasification components can perform staged gasification independently.

Another advantage of the present disclosure is to provide a raw material gasification device, a secondary feeding evaporation device, a film coating device, a film coating apparatus and a feeding and gasification method thereof, wherein two gasification chambers of the raw material gasification device are respectively provided with a heating component, so that the raw material in different states or different gasification degrees can be respectively heated and gasified correspondingly, thereby improving the gasification efficiency.

Another advantage of the present disclosure is to provide a raw material gasification device, a secondary feeding evaporation device, a film coating device, a film coating apparatus and a feeding and gasification method thereof, wherein when the raw material gasification device is heated at a first stage, the liquid raw material is preheated at a lower temperature, and then heated at a higher temperature, so that the chemical raw material can be gradually gasified from a low temperature to a high temperature, thereby further improving the gasification degree.

Another advantage of the present disclosure is to provide a raw material gasification device, a secondary feeding evaporation device, a film coating device, a film coating apparatus and a feeding and gasification method thereof, wherein feeding direction and multi-stage gasification direction of the raw material gasification device are arranged in different directions, so as to extend the gasification path and reduce the space occupation.

Another advantage of the present disclosure is to provide a raw material gasification device, a secondary feeding evaporation device, a film coating device, a film coating apparatus and a feeding and gasification method thereof, wherein in a first-stage gasification component of the raw material gasification device, a raw material inlet is located at a higher position, and a gasification outlet is located at a lower position, so that a liquid chemical raw material can fully enter the first-stage gasification component, thereby avoiding the accumulation or blockage of the chemical raw material.

Another advantage of the present disclosure is to provide a raw material gasification device, a secondary feeding evaporation device, a film coating device, a film coating apparatus and a feeding and gasification method thereof, wherein in a second-stage gasification component of the raw material gasification device, an inlet is located at a lower position, and an outlet is located at a higher position, so that the fully gasified raw material can be discharged, thereby reducing or avoiding outflow of the raw material with insufficient gasification.

Another advantage of the present disclosure is to provide a raw material gasification device, a secondary feeding evaporation device, a film coating device, a film coating apparatus and a feeding and gasification method thereof, wherein two adjacent gasification components in the raw material gasification device are connected in heat-insulating manner, so that the two gasification components can perform heating independently.

Another advantage of the present disclosure is to provide a raw material gasification device, a secondary feeding evaporation device, a film coating device, a film coating apparatus and a feeding and gasification method thereof, wherein the secondary feeding evaporation device can increase a control range of feeding flow of the chemical monomer liquid, which is helpful to expand the application scenario of the secondary feeding evaporation device.

Another advantage of the present disclosure is to provide a raw material gasification device, a secondary feeding evaporation device, a film coating device, a film coating apparatus and a feeding and gasification method thereof, wherein the secondary feeding evaporation device can first convey a process gas through a first feed pipe and/or a second feed pipe to replace air in a cavity, and then convey the chemical monomer liquid through the first feed pipe and/or the second feed pipe to be heated and evaporated in the cavity, thereby effectively avoiding the contact between the chemical monomer and air, so as to ensure the purity and quality of the chemical monomer gas.

Another advantage of the present disclosure is to provide a raw material gasification device, a secondary feeding evaporation device, a film coating device, a film coating apparatus and a feeding and gasification method thereof, wherein the first feed pipe of the secondary feeding evaporation device can also be used to convey the chemical monomer liquid as a backup of the second feed pipe, which helps to improve the working stability and reliability of the secondary feeding evaporation device.

Another advantage of the present disclosure is to provide a raw material gasification device, a secondary feeding evaporation device, a film coating device, a film coating apparatus and a feeding and gasification method thereof, wherein the secondary feeding evaporation device can preheat the chemical monomer liquid conveyed through the feed pipes first, and then evaporate the preheated chemical monomer liquid to form the chemical monomer gas, which is helpful to improve the evaporation efficiency of the secondary feeding evaporation device.

Another advantage of the present disclosure is to provide a raw material gasification device, a secondary feeding evaporation device, a film coating device, a film coating apparatus and a feeding and gasification method thereof, wherein the secondary feeding evaporation device can further heat the chemical monomer gas obtained by evaporation, so that the chemical monomer liquid drops in the chemical monomer gas can be fully evaporated, which is helpful to obtain the chemical monomer gas with more sufficient evaporation, so as to avoid liquid drops in the chemical monomer gas.

Another advantage of the present disclosure is to provide a raw material gasification device, a secondary feeding evaporation device, a film coating device, a film coating apparatus and a feeding and gasification method thereof, wherein a preheating chamber and a heating chamber in the secondary feeding evaporation device are spaced from each other, and the preheating chamber and the heating chamber are communicated with each other through an evaporating chamber, so as to ensure that the preheated chemical monomer liquid first enters the evaporating chamber to be evaporated into chemical monomer gas, and then the chemical monomer gas enters the heating chamber to be heated to required temperature to achieve full evaporation.

Another advantage of the present disclosure is to provide a raw material gasification device, a secondary feeding evaporation device, a film coating device, a film coating apparatus and a feeding and gasification method thereof, wherein the preheating chamber and the heating chamber in the secondary feeding evaporation device are superposed on a same side of a chamber body, and the evaporating chamber is arranged in a cover to be located outside of the preheating chamber and the heating chamber, so that the cover and the discharge pipe are respectively arranged on two opposite sides of the chamber body, which is helpful to disassemble the cover, so as to clean and maintain the preheating chamber, the heating chamber and the evaporating chamber.

Another advantage of the present disclosure is to provide a raw material gasification device, a secondary feeding evaporation device, a film coating device, a film coating apparatus and a feeding and gasification method thereof, wherein the heating chamber of the secondary feeding evaporation device is located below the preheating chamber, so that the chemical monomer gas heated in the heating chamber can meet with the preheated chemical monomer liquid in the preheating chamber in the evaporating chamber, so as to further heat the preheated chemical monomer liquid to evaporate to the chemical monomer gas.

Another advantage of the present disclosure is to provide a raw material gasification device, a secondary feeding evaporation device, a film coating device, a film coating apparatus and a feeding and gasification method thereof, wherein the discharge pipe of the secondary feeding evaporation device is communicated with the heating chamber through an air guide hole penetrating through the chamber body, so that the chemical monomer gas heated in the heating chamber will continue to be heated when passing through the air guide hole, so as to prevent the chemical monomer gas from condensing and carrying liquid drops.

Another advantage of the present disclosure is to provide a raw material gasification device, a secondary feeding evaporation device, a film coating device, a film coating apparatus and a feeding and gasification method thereof, which does not require expensive materials or complex structures. Therefore, the present disclosure can not only provide a simple secondary feeding evaporation device and its feeding method, but also increase the practicability and reliability of the secondary feeding evaporation device and its feeding method.

According to one aspect, the present disclosure provides a raw material gasification device, including:

- a first-stage gasification component for performing a primary gasification on a raw material;
- a second-stage gasification component for performing a further gasification on the raw material after the primary gasification of the first-stage gasification component; and
- a feeding control component for feeding the raw material to be gasified, wherein the feeding control component is controllably communicated with the first-stage gasification component.

In some embodiments, a feeding direction of the feeding control component is in a vertical direction, and the first-stage gasification component and the second-stage gasification component are arranged in a horizontal direction.

In some embodiments, the feeding control component includes a first feed nozzle, a group of control valves and a group of feed pipes, wherein the first feed nozzle, the group of control valves and the group of feed pipes are controllably communicated to form a feeding channel through the group of control valves.

In some embodiments, the feeding channel is in a vertical direction.

In some embodiments, the group of control valves include a first control valve and a second control valve, wherein the first control valve is connected with the first feed nozzle, and the second control valve is connected with the first control valve through a feed pipe.

In some embodiments, the first control valve is a diaphragm valve and the second control valve is a three-way valve.

In some embodiments, the first-stage gasification component includes a first gasification box, wherein the first gasification box has a preheating chamber and a first heating chamber, and the preheating chamber is partially communicated with the first heating chamber.

In some embodiments, the first gasification box has a first inlet communicated with the preheating chamber, and the feeding control component is connected with the first inlet.

In some embodiments, the first gasification box has a partial communication channel, and the preheating chamber is communicated with the first heating chamber through the partial communication channel.

In some embodiments, the first inlet and the partial communication channel are arranged in a staggered manner.

In some embodiments, the preheating chamber and the first heating chamber are arranged vertically in parallel.

In some embodiments, the first-stage gasification component includes a group of heating components, and the group of heating components include a preheating component and a first heating component, wherein the preheating component heats the preheating chamber, the first heating component heats the first heating chamber, and the preheating component and the first heating component perform heating independently.

In some embodiments, the first gasification box has a first outlet communicated with the first heating chamber, and the first outlet is arranged opposite to the partial communication channel.

In some embodiments, a position of the first inlet is higher than a position of the first outlet.

In some embodiments, the first gasification box includes a first body and a first cover detachably connected to the first body, and the first cover and the first body are connected to form the preheating chamber and the first heating chamber.

In some embodiments, the first gasification box includes a first seal arranged at a position where the first cover and the first body are connected with each other.

In some embodiments, the first body includes a partition wall dividing an interior of the first body into two spaces.

In some embodiments, the partial communication channel is formed between the first cover and a top of the partition wall.

In some embodiments, the first inlet is arranged opposite to the partition wall.

In some embodiments, the second-stage gasification component includes a second gasification box, and the second gasification box has a second heating chamber and a second inlet, wherein the second inlet is communicated with the second heating chamber, and the second inlet is communicated with the first heating chamber.

In some embodiments, the first gasification box has a first discharge nozzle, the second gasification box has a second feed nozzle, and the first discharge nozzle is extended to be connected to the second feed nozzle.

In some embodiments, the first discharge nozzle extends into the second feed nozzle.

In some embodiments, the raw material gasification device further includes a heat insulating seal arranged at a position where the first gasification box is connected with the second gasification box.

In some embodiments, the second-stage gasification component includes a second heating component for heating the second gasification box.

In some embodiments, the second gasification box has a second outlet, and a position of the second outlet is higher than a position of the second inlet.

In some embodiments, the second gasification box includes a second body and a second cover detachably connected to the second body.

In some embodiments, the raw material gasification device provides a film coating device with a gaseous chemical raw material, and the film coating device forms a film layer by plasma vapor deposition.

According to another aspect, the present disclosure provides a raw material gasification device, including:

- a first-stage gasification component for performing a primary gasification on a raw material;
- a second-stage gasification component for performing a further gasification on the raw material after the primary gasification of the first-stage gasification component; and
- a feeding control component for feeding the raw material to be gasified, wherein the feeding control component is controllably communicated with the first-stage gasification component, wherein the first-stage gasification component includes a first gasification box, and the second-stage gasification component includes a second gasification box, wherein the raw material gasification device further includes a heat insulating seal arranged at a position where the first gasification box is connected with the second gasification box.

In some embodiments, the first gasification box has a preheating chamber and a first heating chamber, and the preheating chamber is partially communicated with the first heating chamber.

According to another aspect, the present disclosure provides a raw material gasification method, including:

- providing a multi-stage gasification component for heating and evaporating a liquid raw material stage by stage in the multi-stage gasification component to extend a gasification path.

In some embodiments, the raw material gasification method further includes:

- providing a feeding channel arranged longitudinally and a gasification channel arranged transversely.

In some embodiments, the raw material gasification method further includes:

- thermally isolating gasification components connected with each other.

According to another aspect, the present disclosure provides a film coating apparatus, including:

- a film coating device for forming a film layer by plasma vapor deposition; and a raw material gasification device for providing a gasification raw material for the film coating device;

wherein the raw material gasification device includes:

- a first-stage gasification component for performing a primary gasification on a raw material;
- a second-stage gasification component for performing a further gasification on the raw material after the primary gasification of the first-stage gasification component; and
- a feeding control component for feeding the raw material to be gasified, wherein the feeding control component is controllably communicated with the first-stage gasification component.

In some embodiments, a feeding direction of the feeding control component is in a vertical direction, and the first-stage gasification component and the second-stage gasification component are arranged in a horizontal direction.

In some embodiments, the feeding control component includes a first feed nozzle, a group of control valves and a group of feed pipes, wherein the first feed nozzle, the group of control valves and the group of feed pipes are controllably communicated to form a feeding channel through the group of control valves.

In some embodiments, the feeding channel is in a vertical direction.

In some embodiments, the group of control valves include a first control valve and a second control valve, wherein the first control valve is connected with the first feed nozzle, and the second control valve is connected with the first control valve through a feed pipe.

In some embodiments, the first control valve is a diaphragm valve and the second control valve is a three-way valve.

In some embodiments, the first-stage gasification component includes a first gasification box, wherein the first gasification box has a preheating chamber and a first heating chamber, and the preheating chamber is partially communicated with the first heating chamber.

In some embodiments, the first gasification box has a first inlet communicated with the preheating chamber, and the feeding control component is connected with the first inlet.

In some embodiments, the first gasification box has a partial communication channel, and the preheating chamber is communicated with the first heating chamber through the partial communication channel.

In some embodiments, the first inlet and the partial communication channel are arranged in a staggered manner.

In some embodiments, the preheating chamber and the first heating chamber are arranged vertically in parallel.

In some embodiments, the first-stage gasification component includes a group of heating components, and the group of heating components include a preheating component and a first heating component, wherein the preheating component heats the preheating chamber, the first heating component heats the first heating chamber, and the preheating component and the first heating component perform heating independently.

In some embodiments, the first gasification box has a first outlet communicated with the first heating chamber, and the first outlet is arranged opposite to the partial communication channel.

In some embodiments, a position of the first inlet is higher than a position of the first outlet.

In some embodiments, the first gasification box includes a first body and a first cover detachably connected to the first body, and the first cover and the first body are connected to form the preheating chamber and the first heating chamber.

In some embodiments, the first gasification box includes a first seal arranged at a position where the first cover and the first body are connected with each other.

In some embodiments, the first body includes a partition wall dividing an interior of the first body into two spaces.

In some embodiments, the partial communication channel is formed between the first cover and a top of the partition wall.

In some embodiments, the first inlet is arranged opposite to the partition wall.

In some embodiments, the second-stage gasification component includes a second gasification box, and the second gasification box has a second heating chamber and a second inlet, wherein the second inlet is communicated with the second heating chamber, and the second inlet is communicated with the first heating chamber.

In some embodiments, the first gasification box has a first discharge nozzle, the second gasification box has a second feed nozzle, and the first discharge nozzle is extended to be connected to the second feed nozzle.

In some embodiments, the first discharge nozzle extends into the second feed nozzle.

In some embodiments, the raw material gasification device further includes a heat insulating seal arranged at a position where the first gasification box is connected with the second gasification box.

In some embodiments, the second-stage gasification component includes a second heating component for heating the second gasification box.

In some embodiments, the second gasification box has a second outlet, and a position of the second outlet is higher than a position of the second inlet.

In some embodiments, the second gasification box includes a second body and a second cover detachably connected to the second body.

In some embodiments, the raw material gasification device provides a film coating device with a gaseous chemical raw material, and the film coating device forms a film layer by plasma vapor deposition.

According to another aspect, the present disclosure provides a film coating apparatus, including:

- a film coating device for forming a film layer by plasma vapor deposition; and
- a raw material gasification device for providing a gasification raw material for the film coating device;

wherein the raw material gasification device includes:

- a first-stage gasification component for performing a primary gasification on a raw material;
- a second-stage gasification component for performing a further gasification on the raw material after the primary gasification of the first-stage gasification component; and
- a feeding control component for feeding the raw material to be gasified, wherein the feeding control component is controllably connected to the first-stage gasification component, wherein the first-stage gasification component includes a first gasification box, and the second-stage gasification component includes a second gasification box, wherein the raw material gasification device further includes a heat insulating seal arranged at a position where the first gasification box is connected with the second gasification box.

In some embodiments, the first gasification box has a preheating chamber and a first heating chamber, and the preheating chamber is partially communicated with the first heating chamber.

According to another aspect, the present disclosure provides a secondary feeding evaporation device for heating a chemical monomer liquid through a heating device to evaporate into a chemical monomer gas for performing coating. The secondary feeding evaporation device includes:

- an evaporator body having a cavity and a heating installation component, wherein the cavity is used to receive the chemical monomer liquid, and the heating installation component is used to install the heating device, so that the heating device heats the chemical monomer liquid in the cavity to evaporate into the chemical monomer gas; and
- a pipe component including a first feed pipe, a second feed pipe and a discharge pipe, wherein the first feed pipe and the second feed pipe are respectively communicated with the cavity of the evaporator body to respectively feed the chemical monomer liquid to the cavity, and the discharge pipe is communicated with the cavity of the evaporator body to discharge the chemical monomer gas obtained by evaporation from the cavity.

In some embodiments, the first feed pipe and/or the second feed pipe of the pipe component also feed a process gas to the cavity to replace air in the cavity.

In some embodiments, the cavity of the evaporator body includes a preheating chamber and an evaporating chamber communicated with each other, wherein the first feed pipe and the second feed pipe are directly communicated with the preheating chamber, so as to enable the chemical monomer liquid conveyed through the first feed pipe and/or the second feed pipe to first enter the preheating chamber to be preheated, and then enter the evaporating chamber to be evaporated into the chemical monomer gas.

In some embodiments, the cavity of the evaporator body further includes a heating chamber communicated with the evaporating chamber, and the discharge pipe is communicated with the heating chamber, so that the chemical monomer gas obtained by evaporation in the evaporating chamber can continue to be heated in the heating chamber before being discharged through the discharge pipe.

In some embodiments, the preheating chamber and the heating chamber in the evaporator body are superposed and spaced from each other, and the evaporating chamber is arranged on a same side of the preheating chamber and the heating chamber, so that the evaporating chamber is communicated with the preheating chamber and the heating chamber respectively.

In some embodiments, the preheating chamber in the evaporator body is arranged above the heating chamber.

In some embodiments, the evaporator body includes a chamber body and a cover, and the cover is detachably arranged on a side of the chamber body to form the cavity between the cover and the chamber body.

In some embodiments, the preheating chamber and the heating chamber in the evaporator body are spaced from each other in the chamber body, and the evaporating chamber in the evaporator body is correspondingly arranged in the cover.

In some embodiments, the discharge pipe and the cover in the evaporator body are correspondingly arranged on two opposite sides of the chamber body.

In some embodiments, the evaporator body further has an air guide hole, and the air guide hole extends through the chamber body so that the discharge pipe is communicated with the heating chamber through the air guide hole.

In some embodiments, the heating installation component of the evaporator body is an insertion hole, and the insertion hole is arranged in the chamber body so that the heating device can be installed by inserting into the insertion hole.

In some embodiments, the insertion hole in the evaporator body is not communicated with the cavity so that heat generated by the heating device is transferred to the cavity through the chamber body.

In some embodiments, the pipe component further includes a plurality of control valves, and the plurality of control valves are respectively correspondingly installed to the first feed pipe and the second feed pipe to respectively control flow of the chemical monomer liquid conveyed through the first feed pipe and/or the second feed pipe.

According to another aspect, the present disclosure provides a method of operating a secondary feeding evaporation device, including:

feeding a chemical monomer liquid to a cavity of an evaporator body through a first fee pipe and/or a second feed pipe of a pipe component;

heating the evaporator body by a heating device and evaporating the chemical monomer liquid in the cavity into a chemical monomer gas; and discharging the chemical monomer gas from the cavity through a discharge pipe of the pipe component for performing coating.

In some embodiments, the method further includes:

feeding a process gas to the cavity of the evaporator body to replace air in the cavity through the first feed pipe and/or the second feed pipe of the pipe component.

In some embodiments, heating the evaporator body by the heating device to evaporate the chemical monomer liquid in the cavity into the chemical monomer gas includes:

preheating the chemical monomer liquid conveyed through the first feed pipe and/or the second feed pipe in a preheating chamber of the cavity; and evaporating the preheated chemical monomer liquid in an evaporating chamber of the cavity to obtain the chemical monomer gas.

In some embodiments, heating the evaporator body by the heating device to evaporate the chemical monomer liquid in the cavity into the chemical monomer gas further includes:

heating and evaporating the obtained chemical monomer gas in a heating chamber of the cavity.

According to another aspect, the present disclosure provides a film coating device for forming a polymer film layer on a surface of a workpiece to be coated by polymerization of a chemical monomer gas. The film coating device includes:

a coating body; and a secondary feeding evaporation device, including:

an evaporator body having a cavity and a heating installation component, wherein the cavity is used to receive a chemical monomer liquid, and the heating installation component is used to install the heating device, so that the heating device heats the chemical monomer liquid in the cavity to evaporate into the chemical monomer gas; and a pipe component including a first feed pipe, a second feed pipe and a discharge pipe, wherein the first feed pipe and the second feed pipe are respectively communicated with the cavity of the evaporator body to respectively feed the chemical monomer liquid to the cavity, and the discharge pipe communicates the cavity of the evaporator body with the coating body to convey the chemical monomer gas obtained by evaporation from the cavity to the coating body for subsequent coating operation through the coating body.

In some embodiments, the first feed pipe and/or the second feed pipe of the pipe component also feed a process gas to the cavity to replace air in the cavity.

In some embodiments, the cavity of the evaporator body includes a preheating chamber and an evaporating chamber communicated with each other, wherein the first feed pipe and the second feed pipe are directly communicated with the preheating chamber, so as to enable the chemical monomer liquid conveyed through the first feed pipe and/or the second feed pipe to first enter the preheating chamber to be preheated, and then enter the evaporating chamber to be evaporated into the chemical monomer gas.

In some embodiments, the cavity of the evaporator body further includes a heating chamber communicated with the evaporating chamber, and the discharge pipe is communicated with the heating chamber, so that the chemical monomer gas obtained by evaporation in the evaporating chamber can continue to be heated in the heating chamber before being discharged through the discharge pipe.

In some embodiments, the preheating chamber and the heating chamber in the evaporator body are superposed and spaced from each other, and the evaporating chamber is arranged on a same side of the preheating chamber and the heating chamber, so that the evaporating chamber is communicated with the preheating chamber and the heating chamber respectively.

In some embodiments, the preheating chamber in the evaporator body is arranged above the heating chamber.

In some embodiments, the evaporator body includes a chamber body and a cover, and the cover is detachably arranged on a side of the chamber body to form the cavity between the cover and the chamber body.

In some embodiments, the preheating chamber and the heating chamber in the evaporator body are spaced from each other in the chamber body, and the evaporating chamber in the evaporator body is correspondingly arranged in the cover.

In some embodiments, the discharge pipe and the cover in the evaporator body are correspondingly arranged on two opposite sides of the chamber body.

In some embodiments, the evaporator body further has an air guide hole, and the air guide hole extends through the chamber body so that the discharge pipe is communicated with the heating chamber through the air guide hole.

In some embodiments, the heating installation component of the evaporator body is an insertion hole, and the insertion hole is arranged in the chamber body so that the heating device can be installed by inserting into the insertion hole.

In some embodiments, the insertion hole in the evaporator body is not communicated with the cavity so that heat generated by the heating device is transferred to the cavity through the chamber body.

In some embodiments, the coating body includes a reaction cavity, a vacuum pumping pipe and a bracket, wherein the discharge pipe of the secondary feeding evaporation device is communicated with the reaction cavity to supply the chemical monomer gas to the reaction cavity through the secondary feeding evaporation device, wherein the bracket is arranged in the reaction cavity for placing the workpiece to be coated, and the vacuum pumping pipe is suitable for connecting the reaction cavity and a vacuum pump for vacuuming the reaction cavity through the vacuum pump, so that the film coating device can perform vacuum coating on the workpiece to be coated.

Still further objects and advantages will become apparent from a consideration of the ensuing description and drawings.

These and other objectives, features, and advantages of the present disclosure will become apparent from the following detailed description, the accompanying drawings, and the appended claims.

DETAILED DESCRIPTION

The following description is used to disclose the present disclosure in order to enable one skilled in the art to practice the disclosure. Preferred embodiments in the following description are given by way of example only, and other obvious variations will occur to those skilled in the art. The basic principles of the present disclosure defined in the following description can be applied to other embodiments, variations, modifications, equivalents, and other technical schemes without departing from the scope of the present disclosure.

It should be appreciated by those skilled in the art that, in the context of the present disclosure, terms "longitudinal", "lateral", "upper", "lower", "front", "back", "left", "right", "vertical", "horizontal", "top", "bottom", "inner", "outer" are based on orientation or positional relationships illustrated in the figures, which are merely for convenience in describing and simplifying the present disclosure, and do not indicate or imply that devices or components must have a particular orientation and be constructed and operated in a particular orientation, thus the above terms should not be construed as limiting the present disclosure.

It should be understood that the term "a" or "an" should be interpreted as "at least one" or "one or more", that is, in some embodiments, the number of one component may be one, and in other embodiments, the number of the component may be multiple, thus the term "a" and "an" should not be construed as limiting the number.

References to "one embodiment", "embodiment", "example embodiment", "various embodiments", "some embodiments" indicate that such embodiments describing the present disclosure may include specific features, structures or characteristics, but not every embodiment must include such features, structures or characteristics. Further, some embodiments may have some, all or none of the features described for other embodiments.

Figure 1A:
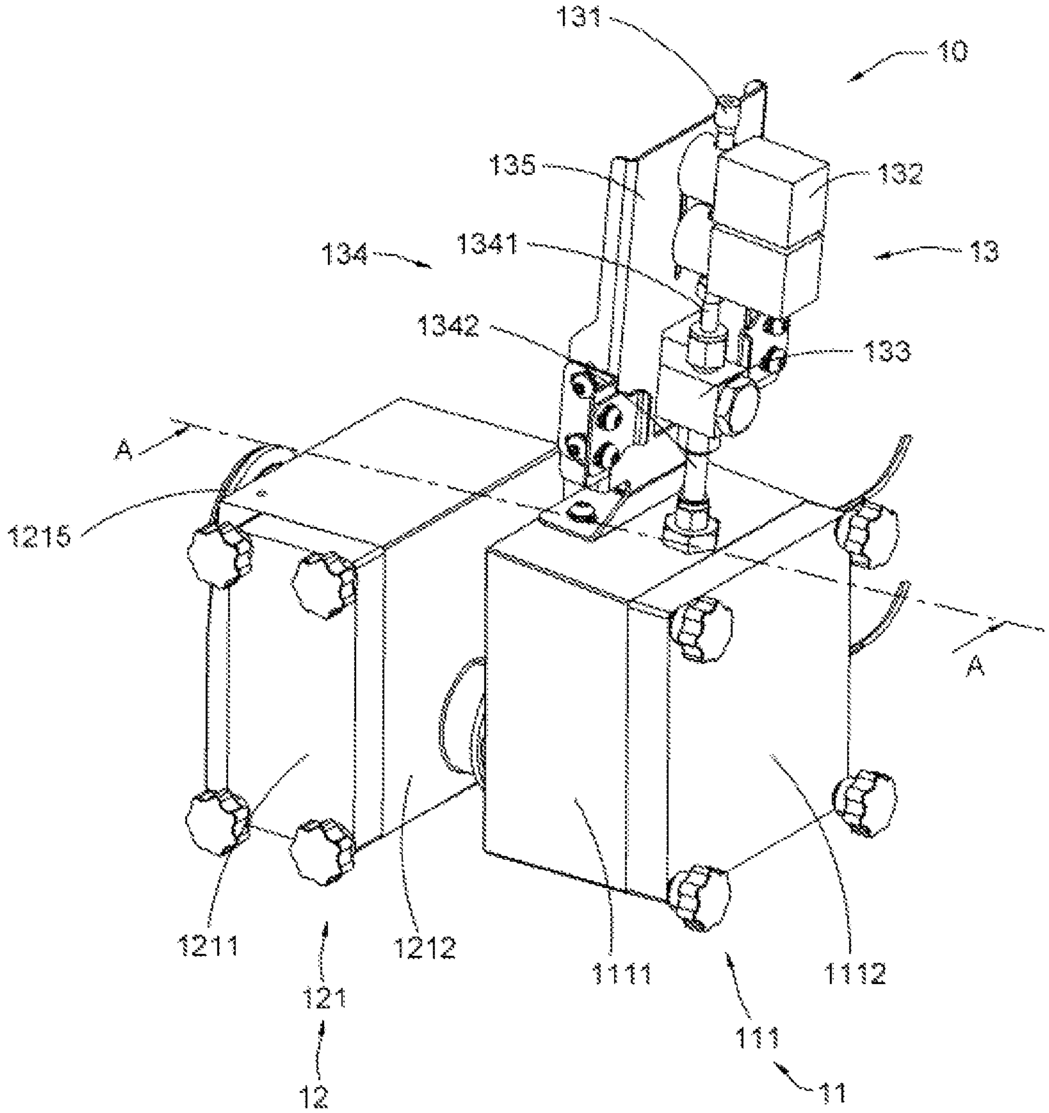
FIGS. 1A and 1B are perspective schematic views of a raw material gasification device from different angles according to a first embodiment of the present disclosure.
Figure 1B:
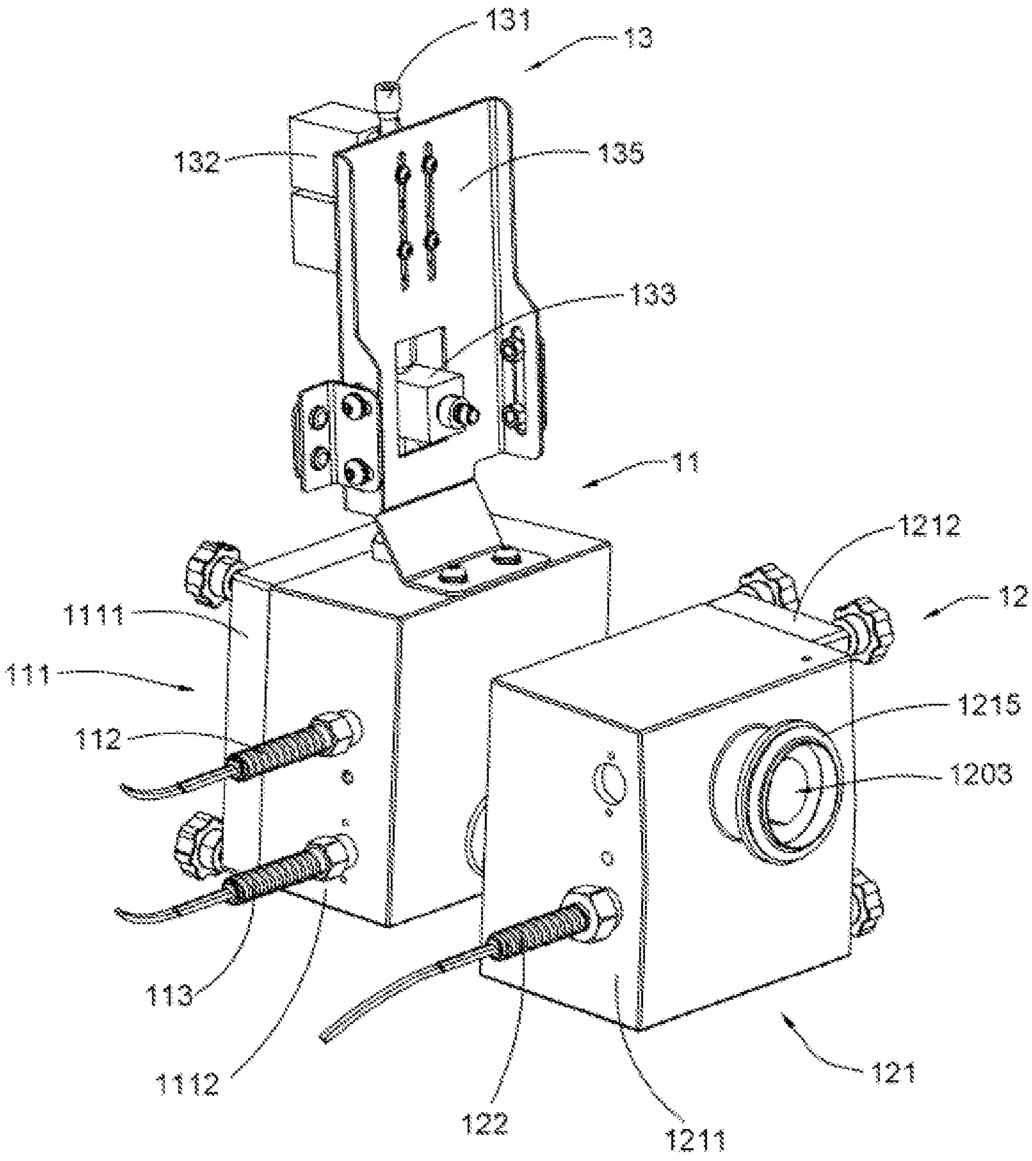
Figure 2:
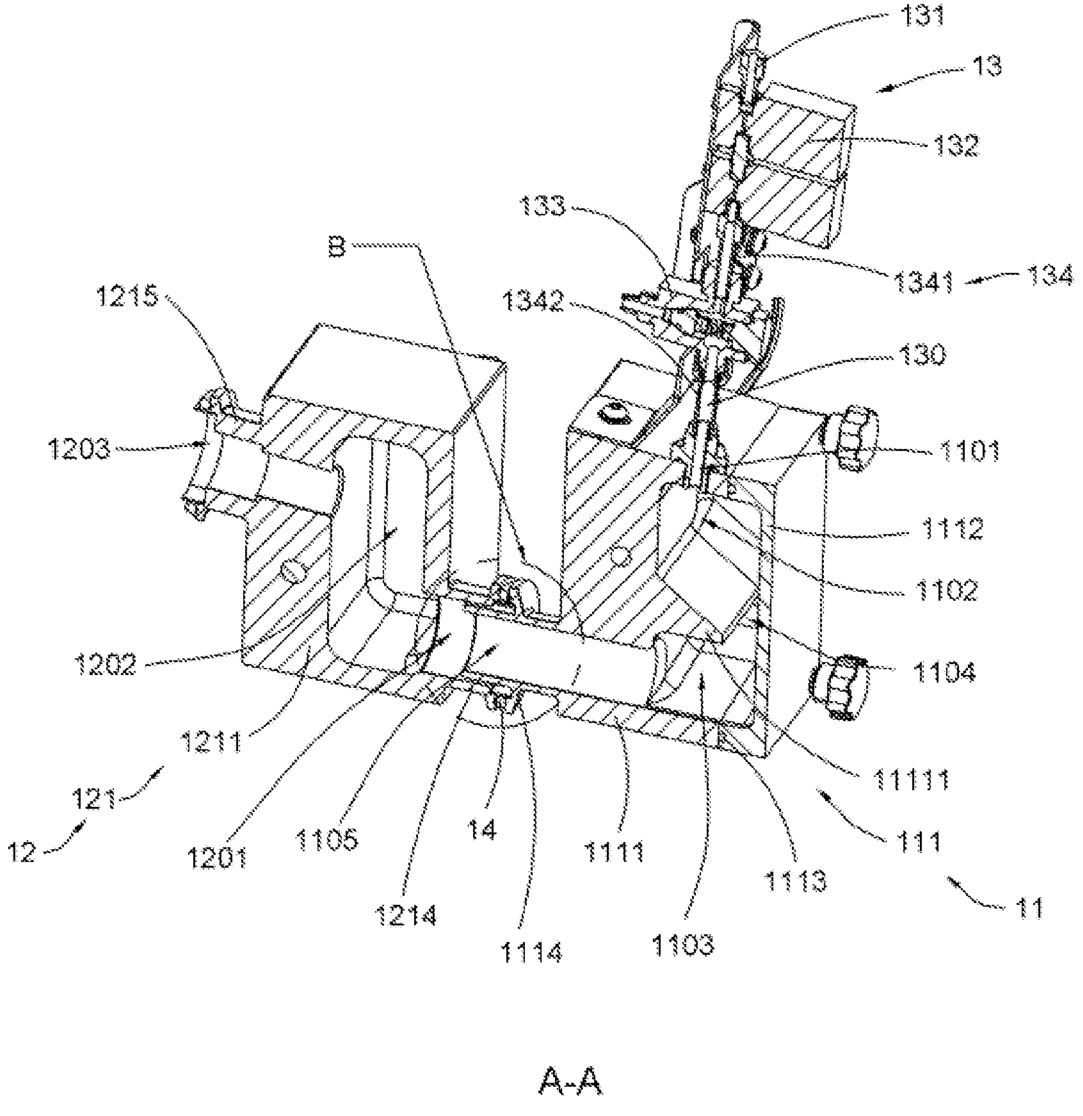
FIG. 2 is a cross-sectional schematic view along line A-A of FIG. 1A.
Figure 3:
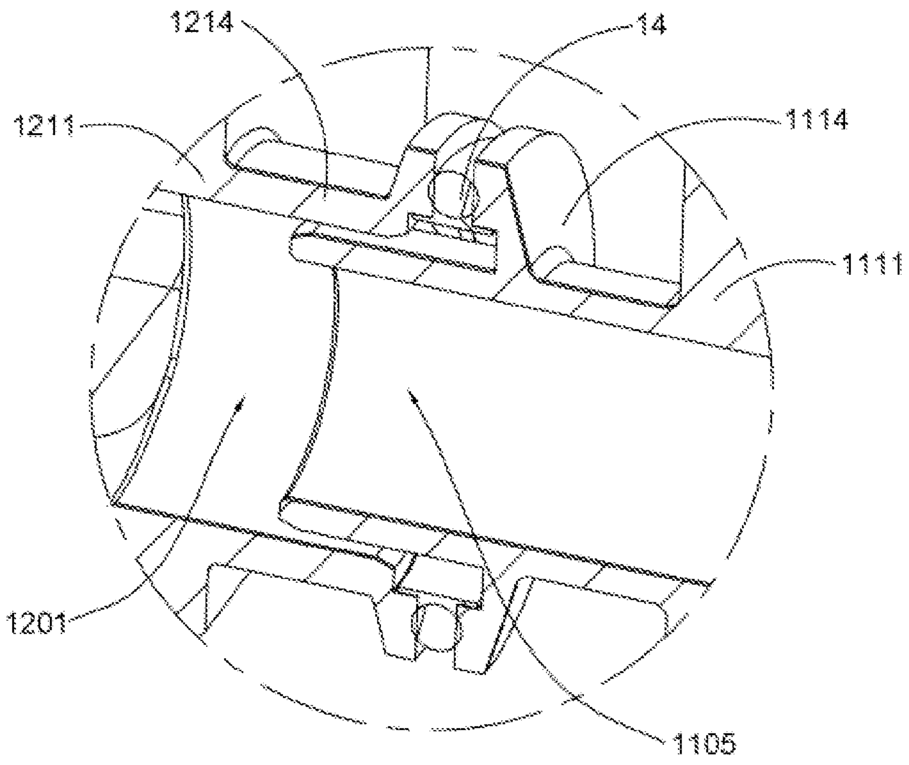
FIG. 3 is a partially enlarged schematic view of position B in FIG. 2.
Figure 4:
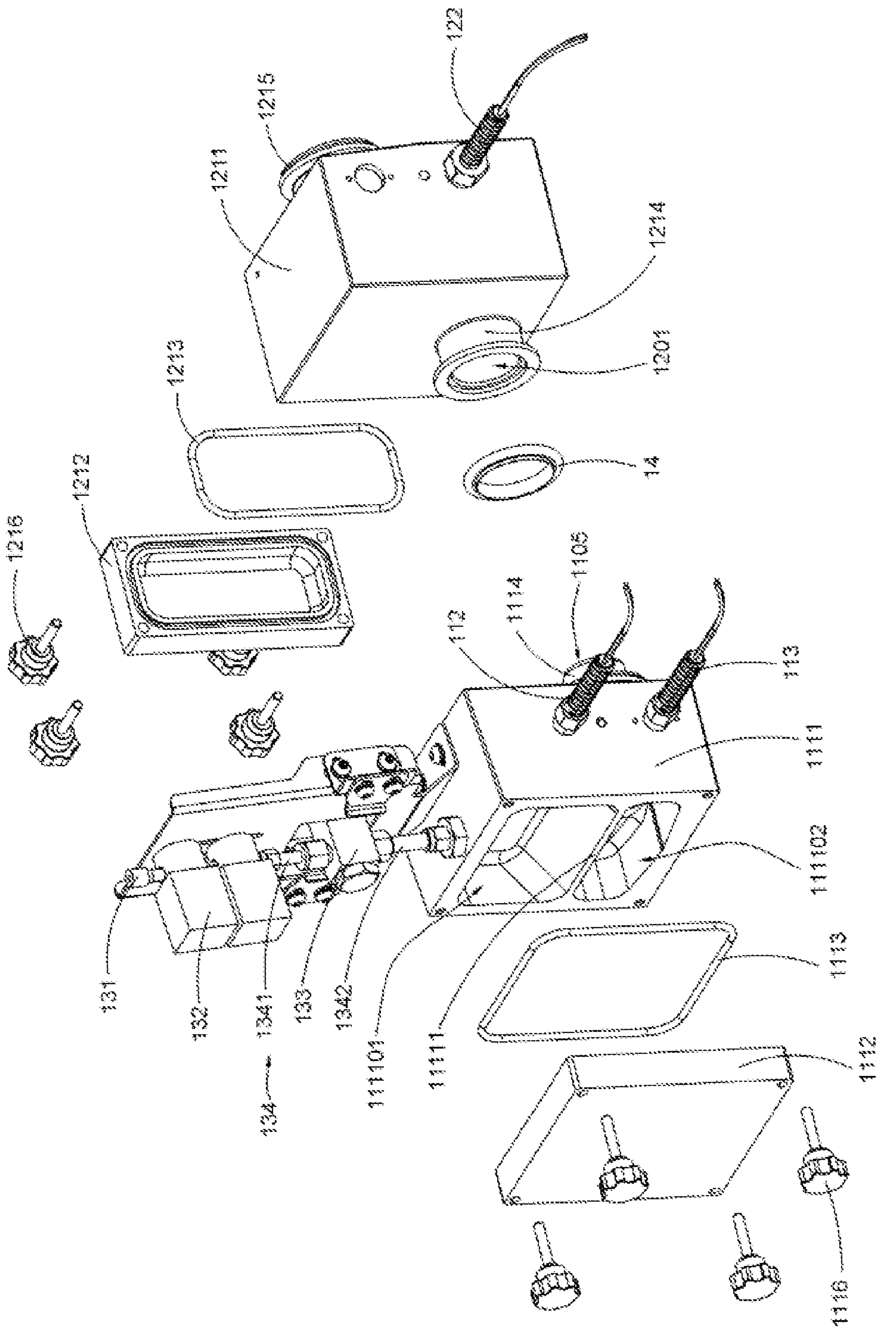
FIG. 4 is an exploded schematic view of the raw material gasification device according to the first embodiment of the present disclosure.
Figure 5:
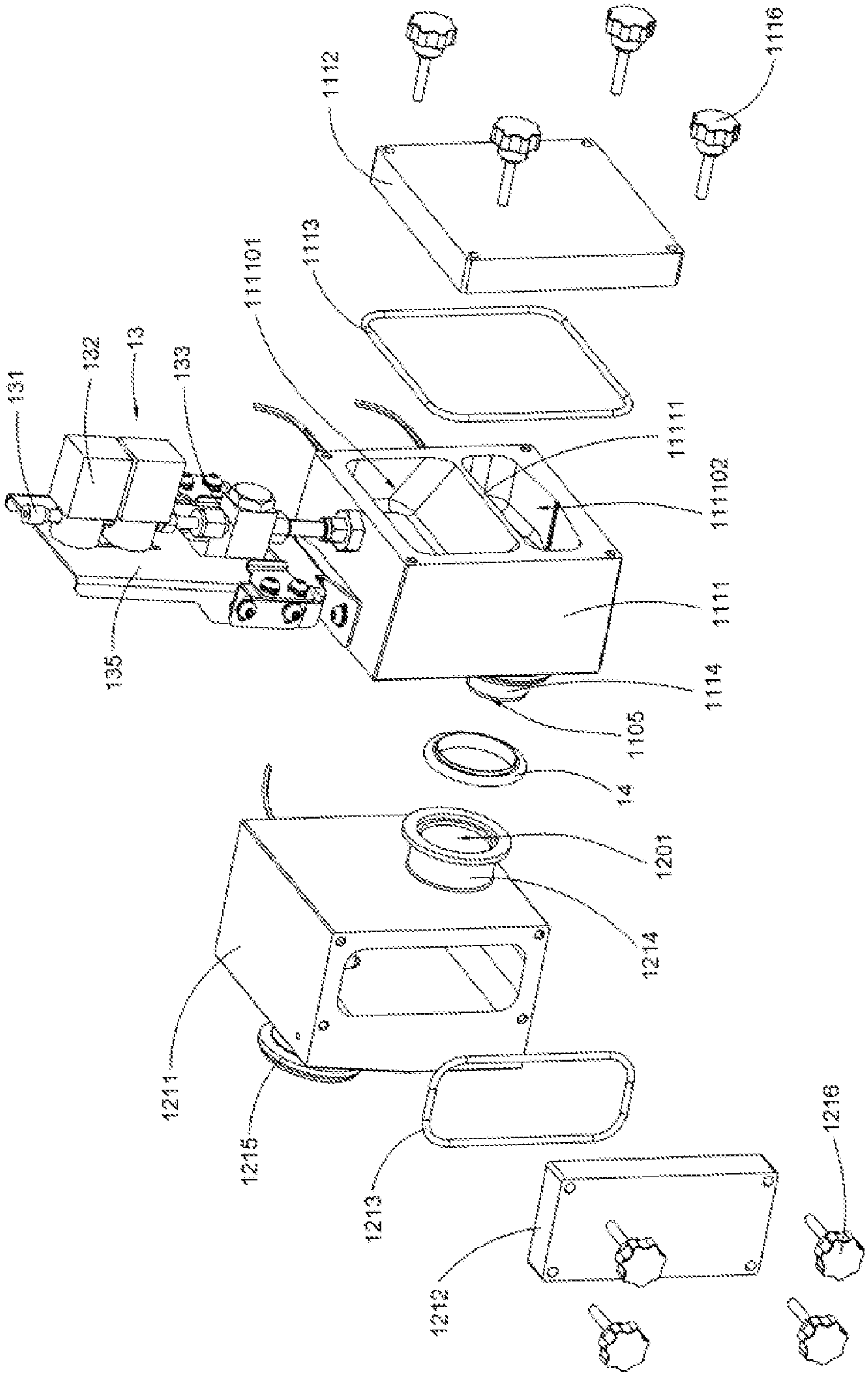
FIG. 5 is another exploded schematic view of the raw material gasification device according to the first embodiment of the present disclosure.
Figure 6:
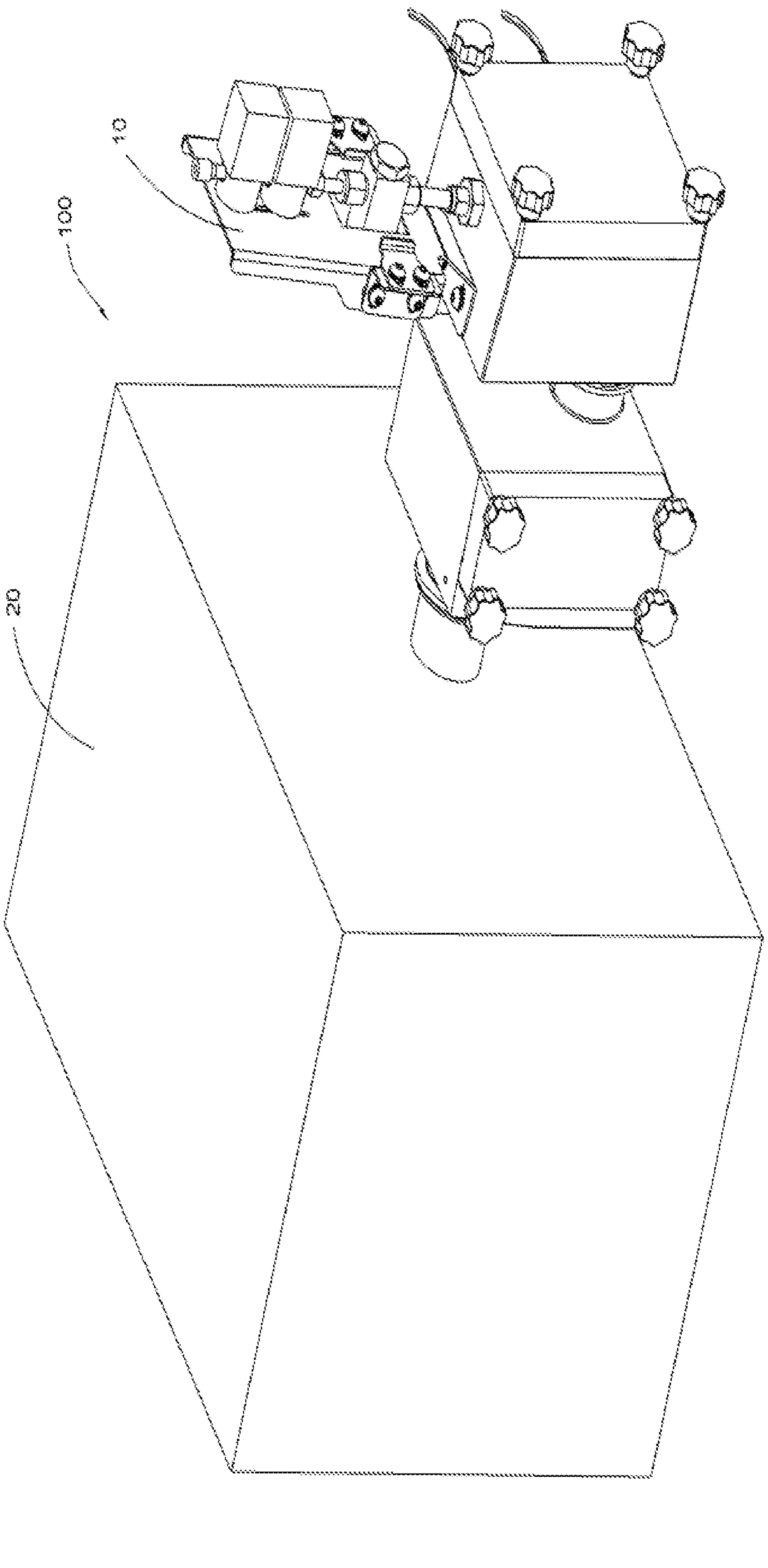
FIG. 6 is a schematic view of a film coating apparatus composed of the raw material gasification device according to the first embodiment of the present disclosure and a film coating device.

FIGS. 1A and 1B are perspective schematic views of a raw material gasification device 10 from different angles according to a first embodiment of the present disclosure. FIG. 2 is a cross-sectional schematic view along line A-A of FIG. 1A. FIG. 3 is a partially enlarged schematic view of position B in FIG. 2. FIG. 4 is an exploded schematic view of the raw material gasification device 10 according to the first embodiment of the present disclosure. FIG. 5 is another exploded schematic view of the raw material gasification device 10 according to the first embodiment of the present disclosure. FIG. 6 is a schematic view of a film coating apparatus 100 composed of the raw material gasification device 10 according to the first embodiment of the present disclosure and a film coating device 20.

With reference to FIGS. 1A to 6, the present disclosure provides a raw material gasification device 10 for gasifying a liquid chemical raw material, that is, for changing the chemical raw material from liquid to gas. Further, the raw material gasification device 10 is used to provide a gaseous chemical raw material for the plasma coating technology. That is to say, the raw material gasification device 10 is suitable for being used in the plasma coating process to convert the liquid chemical raw material into gas for plasma coating.

The raw material gasification device 10 includes a feeding control component 13 and at least two-stage gasification component. The feeding control component 13 is used for feeding a raw material to be gasified. Further, the feeding control component 13 is used for feeding a liquid chemical raw material. That is to say, the liquid chemical raw material can be controllably conveyed into the raw material gasification device 10 through the feeding control component 13. The two-stage gasification component is used for staged gasification of the raw material. Further, the two-stage gasification component can gasify the liquid raw material by heating and evaporation.

Referring to FIGS. 1A to 2, the feeding control component 13 includes a first feed nozzle 131, a group of control valves and a group of feed pipes 134. The first feed nozzle 131 is connected to one of the group of control valves for feeding the chemical raw material. The group of feed pipes 134 are respectively connected with the group of control valves and the feeding control component 13 to form a conveying channel for the liquid raw material.

Further, under the control of the group of control valves, the liquid raw material can be controllably conveyed into the gasification component through the feeding control component 13.

The group of control valves includes a first control valve 132 and a second control valve 133. The first control valve 132 is connected to the first feed nozzle 131, that is, the raw material entering the first feed nozzle 131 is first controlled by the first control valve 132. For example, but not limited to, the first control valve 132 controls the flow and on-off of the liquid raw material. The first control valve 132 may be a diaphragm valve. The diaphragm valve is used for controlling the flow and dosing the flow of the incoming liquid.

Further, the first control valve 132 includes two diaphragm valves connected through a feed pipe. The feed pipe is a dosed feed pipe, and an internal volume of the feed pipe can be set in advance. When the liquid enters, the first diaphragm valve opens. Under the action of gravity or negative pressure, the liquid enters the feed pipe between the two diaphragm valves. Then, the first diaphragm valve closes and the second diaphragm valve opens. The liquid in the feed pipe between the two diaphragm valves flows to the second control valve 133 and enters the gasification component through the second control valve 133.

The first control valve 132 is communicated with the second control valve 133 through a first feed pipe 1341, that is, the incoming liquid raw material controlled by the first control valve 132 is conveyed to the second control valve 133 through the feed pipe 134.

The second control valve 133 is communicated with the gasification component through a second feed pipe 1342. That is to say, the first feed nozzle 131, the first control valve 132, the first feed pipe 1341, the second control valve 133 and the second feed pipe 1342 can be controllably communicated to form a feeding channel for the raw material.

It should be noted that the second control valve 133 may be a three-way valve. After convenient coating through the three-way valve, air is introduced into the two-stage gasification component from one hole of the three-way valve to purge the two-stage gasification component so as to remove residual gas or liquid chemical raw material.

It should be noted that through the coordinated control of the first control valve 132 and the second control valve 133, the feeding control component 13 can control the entry of the raw material more accurately, and the liquid raw material can be uniformly and quantitatively conveyed to the gasification component, so that the subsequent gasification process can be more stable, which is conducive to enhancing the stability of the plasma coating.

The feeding control component 13 also includes a support 135, and the first control valve 132 and the second control valve 133 are installed on the support 135 so that a feeding channel 130 of the feeding control component 13 is arranged in a predetermined direction.

The two-stage gasification component includes a first-stage gasification component 11 and a second-stage gasification component 12. The first-stage gasification component 11 and the second-stage gasification component 12 perform heating gasification for the raw material at different stages. Further, the raw material entering the raw material gasification device 10 first go through a primary gasification of the first-stage gasification component 11 and then go through a secondary gasification or further gasification of the second-stage gasification component 12. It should be noted that in some embodiments of the present disclosure, the two-stage gasification component is taken as an example to explain the present disclosure. In other embodiments of the present disclosure, the raw material gasification device 10 can also include more gasification components, which is not limited herein.

It should be noted that in some embodiments of the present disclosure, setting multi-stage gasification components can extend a gasification path and improve gasification efficiency.

Referring to FIG. 1B, the first-stage gasification component 11 includes a first gasification box 111 and a group of heating components. The group of heating components are used to heat the first gasification box 111 so that the raw material entering the first gasification box 111 are gasified.

Referring to FIG. 2, the first gasification box 111 has a first inlet 1101, and the second feed pipe 1342 is connected with the first inlet 1101, that is, the raw material conveyed by the feeding control component 13 enters the first gasification box 111 of the first-stage gasification component 11 through the first inlet 1101.

The first feed nozzle 131, the group of control valves, and the group of feed pipes 134 are substantially arranged in a straight line. The first feed nozzle 131, the group of control valves, the group of feed pipes 134 and the first inlet 1101 can be controllably communicated to form the feeding channel 130. For the convenience of explanation, the direction of the feeding channel 130 is defined as a vertical direction. That is to say, the feeding channel 130 extends in the vertical direction. In other words, after entering the feeding channel 130, the on-off and flow of the liquid chemical raw material can be controlled by the group of control valves, and the liquid chemical raw material can flow under the action of gravity.

The first gasification box 111 has a preheating chamber 1102 and a first heating chamber 1103. The preheating chamber 1102 is partially communicated with the first heating chamber 1103, and the first inlet 1101 is communicated with the preheating chamber 1102, that is, the raw material entering the first gasification box 111 first enter the first preheating chamber 1102, and then is gradually conveyed to the first heating chamber 1103 after being preheated by the first preheating chamber 1102.

It should be noted that the preheating chamber 1102 and the first heating chamber 1103 are partially communicated with each other, that is, the interior of the first gasification box is not a whole communication space, but a space partially isolated from each other, and the incoming raw material can slowly flow through the mutually isolated and communicated spaces to be gradually heated.

Further, the preheating chamber 1102 and the first heating chamber 1103 are arranged in parallel to each other in the vertical direction, that is, the preheating chamber 1102 is arranged above the first heating chamber 1103. After entering the first inlet 1101, the raw material first enters the preheating chamber 1102 and then enters the first heating chamber 1103.

Referring to FIG. 2, a partial communication channel 1104 is arranged between the preheating chamber 1102 and the first heating chamber, so that the preheating chamber 1102 and the first heating chamber 1103 are partially communicated with each other. Furthermore, the preheating chamber 1102 and the first heating chamber 1103 are laterally partially communicated with other. It should be noted that the partial communication channel 1104 and the first inlet 1101 are arranged in a staggered manner, that is, the partial communication channel 1104 and the first inlet 1101 are not arranged in the same straight line. With this arrangement, the chemical raw material entering from the first inlet 1101 will not directly enter the first heating chamber 1103, but will stay in the preheating chamber 1102 in advance for sufficient preheating.

It should be noted that the gasification path of the chemical raw material in the raw material gasification device 10 can be initially extended by setting the positions of the preheating chamber 1102 and the first heating chamber 1103, thereby improving the gasification efficiency of the liquid chemical raw material.

Further, referring to FIG. 1B, the group of heating components of the first-stage gasification component 11 include a preheating component 112 and a first heating component 113. The preheating component 112 heats the preheating chamber 1102, and the first heating chamber 1103 heats the first heating chamber 1103. It should be noted that the preheating component 112 and the first heating component 113 can independently heat the preheating chamber 1102 and the first heating chamber 1103. That is to say, the preheating component 112 and the first heating component 113 can provide different or differentiated heating conditions for the preheating chamber 1102 and the first heating chamber 1103 respectively, so that the heating conditions of the preheating chamber 1102 and the first heating chamber 1103 are respectively compatible with the state of the chemical raw material therein, which can promote the gasification of the chemical raw material therein.

It should be noted that in the first stage of heating, the liquid raw material is preheated at a lower temperature, and then heated at a higher temperature, so that the chemical raw material can be gradually gasified from a low temperature to a high temperature, which can further improve the degree of gasification.

Further, referring to FIGS. 4 and 5, the first gasification box 111 includes a first body 1111 and a first cover 1112, and the first cover 1112 is detachably connected to the first body 1111. When the first cover 1112 is combined with the first body 1111, the preheating chamber 1102 and the first heating chamber 1103 are formed between the first cover 1112 and the first body 1111. For example, the first cover 1112 is detachably fixed to the first body 1111 through a first group of fixing components 1116.

The first body 1111 includes a partition wall 11111, and the separating wall 11111 divides an interior of the first gasification box 111 into two spaces, namely a first compartment and the second compartment 111102. The first compartment 111101 and the second compartment 111102 form the preheating chamber 1102 and the first heating chamber 1103 respectively with an inner space of the first cover 1112. The partial communication channel 1104 is formed between an inner side of the first cover 1112 and a top of the partition wall 11111. It should be noted that the partition wall 11111 can have a same height as a side wall of the first body 1111, or be higher or lower than the side wall of the first body 1111.

It should be noted that the first inlet 1101 is arranged opposite to the partition wall 11111, so that the raw material entering the first inlet 1101 will not directly reach the partial communication channel 1104, but will stay in the preheating chamber 1102 for a relatively long time through the buffering effect of the partition wall 11111, so that the raw material can be preheated more sufficiently for preliminary gasification, and the accumulation or blockage of the chemical raw material can be avoided. In other words, when the raw material entering the preheating chamber 1102 from the first inlet 1101 will be blocked by the partition wall 11111 when flowing under the action of gravity.

It should be noted that the first inlet 1101 of the first-stage gasification component 11 is located at a higher position, and a first outlet 1105 is located at a lower position, so that the liquid chemical raw material can sufficiently enter the first-stage gasification component 11, thus the accumulation or blockage of the chemical raw material can be avoided.

The first gasification box 111 also includes a first seal 111. The first seal 111 is arranged between the first body 1111 and the first cover 1112 so that the first cover 1112 is sealedly connected to the first body 1111.

The first gasification box 111 also has a first outlet 1105 communicated with the first heating chamber 1103, that is, the chemical raw material flows out from the first outlet 1105 after being heated by the first heating chamber 1103. Further, the first outlet 1105 and the partial communication channel 1104 are arranged opposite to each other to increase a distance between the partial communication channel 1104 and the first outlet 1105. It should be noted that by setting the positions of the first outlet 1105 and the local communication channel 1104, the gasification path of the chemical raw material in the first gasification box 111 can be extended, which can promote the gasification of the chemical raw material.

Further, the first gasification box 111 has a first discharge nozzle 1114 extending transversely. The first discharge nozzle 1114 forms the first outlet 1105. Furthermore, the first discharge nozzle 1114 extends into the second-stage gasification component 12, so that the connection between the first-stage gasification component 11 and the second-stage gasification component 12 can be stable and have good sealing performance.

In some embodiments, the first outlet 1105 is located at a lower position of the first gasification box 111, so that the raw material in the first gasification box 111 are fully heated and gasified before flowing out.

The second-stage gasification component 12 includes a second gasification box 121 and a second heating component 122. The second heating component 122 can heat the second gasification box 121, so that the raw material after preliminary gasification enters the second gasification box 121 for further gasification.

It should be noted that in some embodiments of the present disclosure, the preheating component 112 can be omitted, and the preheating chamber 1102 can be preheated by the heat provided by the first heating component 113, that is, the liquid raw material entering the preheating chamber 1102 can be preheated. Since the preheating chamber 1102 is arranged adjacent to the first heating chamber 1103, part of the heat of the first heating chamber 1103 can be transferred to the preheating chamber 1102 to provide preheating conditions for the preheating chamber 1102.

The second gasification box 121 has a second inlet 1201. The second inlet 1201 is communicated with the first outlet 1105 of the first gasification component, so that the intermediate raw material flowing out from the first gasification box 111 enters the second gasification box 121. The second gasification box 121 has a second feed nozzle 1214, and the second feed nozzle 1214 extends to be connected to the first feed nozzle 1114. Furthermore, the first feed nozzle 1114 extends into the second feed nozzle 1214, so that the first feed nozzle 1114 is stably and sealedly connected to the second feed nozzle 1214. The second feed nozzle 1214 forms the second inlet 1201.

The second gasification box 121 has a second heating chamber 1202, and the second inlet 1201 is communicated with the second heating chamber 1202, that is, the raw material flowing through the second inlet 1201 enters the second heating chamber 1202 for further heating and gasification.

The second gasification box 121 has a second outlet 1203, that is, the raw material flows out from the second gasification box 121 after being heated and gasified by the second heating chamber 1202.

Further, the second outlet 1203 of the second-stage gasification component 12 is located at a higher position of the second gasification box 121, and the second inlet 1201 is located at a lower position, that is, the position of the second outlet 1203 is higher than the position of the second inlet 1201, so that the raw material entering the second gasification box 121 is automatically lifted from a lower position to enter the second outlet 1203 after being fully gasified, and then flows out. Thus, the gasification rate of the chemical raw material can be improved. In other words, the raw material can be fully gasified before being discharged, so as to avoid mixing liquid in the discharged raw material.

The second gasification box 121 includes a second body 1211 and a second cover 1212, and the second heating chamber 1202 is formed inside the second body 1211 and the second cover 1212. The second cover 1212 is detachably connected to the second body 1211. More specifically, the second cover 1212 can be detachably fixed to the second body 1211 through a second group of fixing components 1216.

The second gasification box 121 includes a second seal 1213. The second seal 1213 is arranged between the second body 1211 and the second cover 1212 so that the second cover 1212 is sealedly connected to the second cover 1212.

The second heating component 122 is installed on the second body 1211 to heat the second body 1211.

It should be noted that, with reference to FIGS. 2 and 3, the raw material gasification device 10 also includes a heat insulating seal 14. The heat insulating seal 14 is arranged at a position where the first gasification box 111 is connected with the second gasification box 121. The heat insulating seal 14 makes the first gasification box 111 and the gasification box 121 sealedly connected with each other so that connection portions between the first gasification box 111 and the second gasification box 121 cannot be directly in contact with each other, thereby preventing heat transfer between the first gasification box and the second gasification box. Furthermore, the first gasification box 111 and the second gasification box 121 can independently heat and gasify the raw material, so as to achieve the effect of staged heating.

Further, the heat insulating seal 14 is arranged at a position where the first discharge nozzle 1114 of the first gasification box 111 and the second feed nozzle 1214 of the second gasification box 121 are connected with each other. More specifically, the first discharge nozzle 1114 and the second feed nozzle 1214 each have a convex part, and the heat insulating seal 14 is clamped between the convex parts of the first discharge nozzle 1114 and the second feed nozzle 1214.

In other words, the first gasification box 111 of the first-stage gasification component 11 and the second gasification box 121 of the second-stage gasification component 12 are not directly in contact with each other to generate heat transfer through the thermal isolation of the gasification components connected by the heat insulating seal 14, so that the raw material can be independently heated.

The second gasification box 121 includes a connector 1215 extending outwards to facilitate the connection with the film coating device 20 and provide a gaseous raw material for the film coating device 20. The connector 1215 extends outwards from the second body 1211.

It should be noted that in some embodiments of the present disclosure, the preheating component 112, the first heating component 113 and the second heating component 122 can perform heating independently, that is, provide different heating conditions respectively, so as to correspond to the raw material in different states or stages respectively, thereby increasing the gasification efficiency of the raw material in corresponding states.

Referring to FIG. 2, the first gasification box 111 is communicated with the second gasification box 121 to form a gasification channel, that is, the entire gasification process of the raw material is completed in the channel formed as a whole by the first gasification box 111 and the second gasification box 121. Furthermore, the first inlet 1101, the preheating chamber 1102, the first heating chamber 1103, the partial communication channel 1104, the first outlet 1105 of the first gasification box 111 and the second inlet 1201, the second heating chamber 1202 and the second outlet 1203 of the second gasification box 121 are intercommunicated to form the gasification channel. In the implementation of the present disclosure, the overall gasification path of the raw material can be extended through the staged arrangement of the first gasification box 111 and the second gasification box 121, as well as corresponding openings and spaces, so that the raw material can be more fully gasified in the raw material gasification device 10, thereby reducing or avoiding liquid doping in the supplied gaseous raw material.

It should be noted that in some embodiments of the present disclosure, the feeding control component 13 is arranged longitudinally, the first-stage gasification component 11 is arranged longitudinally, and the second-stage gasification component 12 is substantially arranged transversely, so that the feeding direction and the multi-stage gasification direction are arranged in different directions, which can reduce the space occupation while extending the gasification path.

FIG. 6 shows a film coating apparatus 100 including the raw material gasification device 10 according to the first embodiment of the present disclosure and the film coating device 20. Referring to FIG. 6, the film coating apparatus 100 includes the film coating device 20 and the raw material gasification device 10, and the raw material gasification device 10 provides the raw material after gasification for the film coating device 20 for performing coating process. The second outlet 1203 of the raw material gasification device 10 is connected with the film coating device 20.

In some embodiments, the film coating device 20 is a plasma coating device 20, that is, a plasma vapor deposition process is performed on the gaseous raw material conveyed by the raw material gasification device 10 to form a film on a surface of a substrate.

It should be noted that in some embodiments of the present disclosure, the raw material gasification device 10 can improve the gasification efficiency of the chemical raw material by extending the gasification path, adjusting the heating gasification temperature and providing multi-stage cooperative gasification, so as to reduce the accumulation and blockage of the raw material, which can provide the film coating device 20 with more suitable raw material for coating, make the film thickness of the film coating device 20 more uniform and make the performance more stable.

Figure 7:
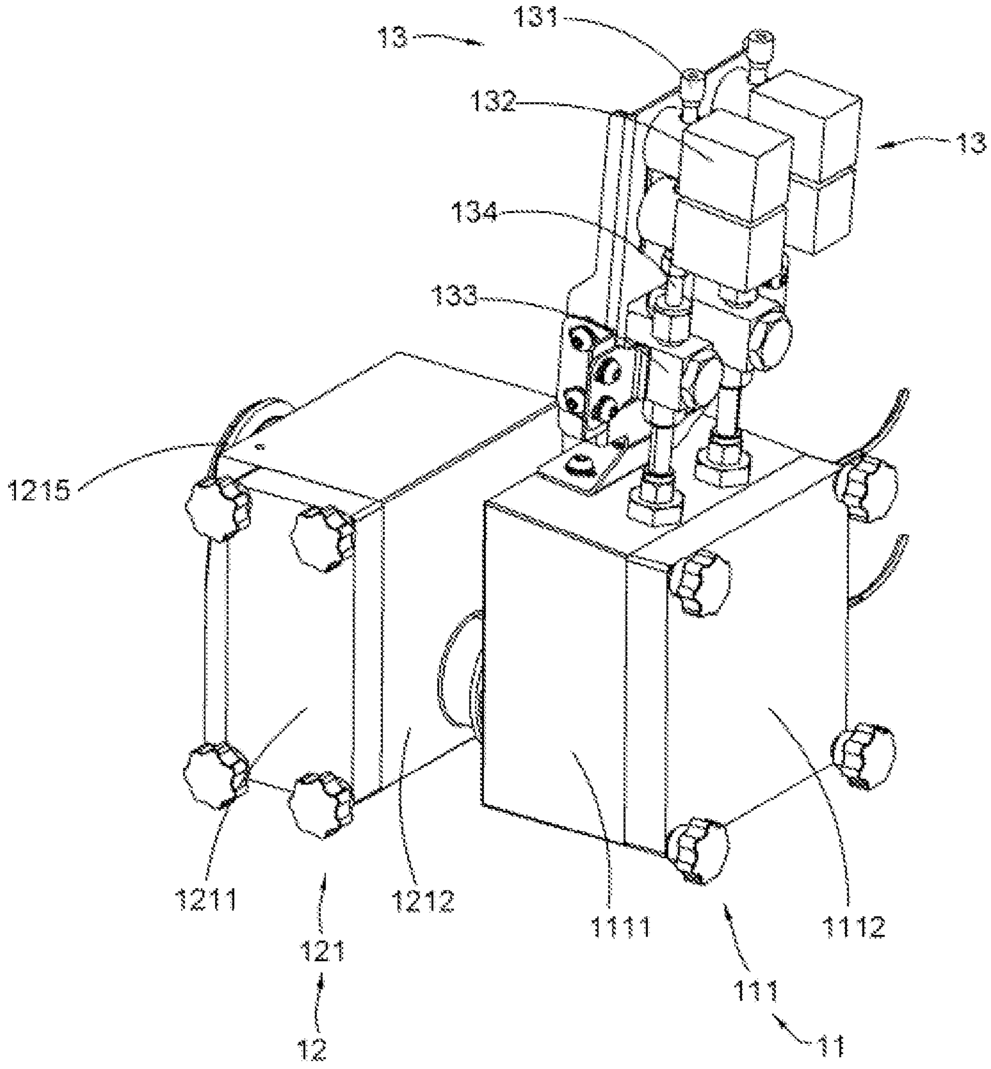
FIG. 7 is a schematic view of a raw material gasification device according to a second embodiment of the present disclosure.

FIG. 7 is a schematic view of a raw material gasification device 10 according to a second embodiment of the present disclosure.

In some embodiments of the present disclosure, the feed gasification device 10 includes two feeding control components 13 respectively connected to the first-stage gasification component 11. Accordingly, the first-stage gasification component 11 includes two first inlets 1101 respectively communicated with the preheating chamber 1102.

It should be noted that the same or different raw materials can be simultaneously conveyed through the two feeding control components 13 to meet the raw material demand of mixed gasification. Further, the two feeding control components 13 are arranged in parallel with each other.

Figure 8:
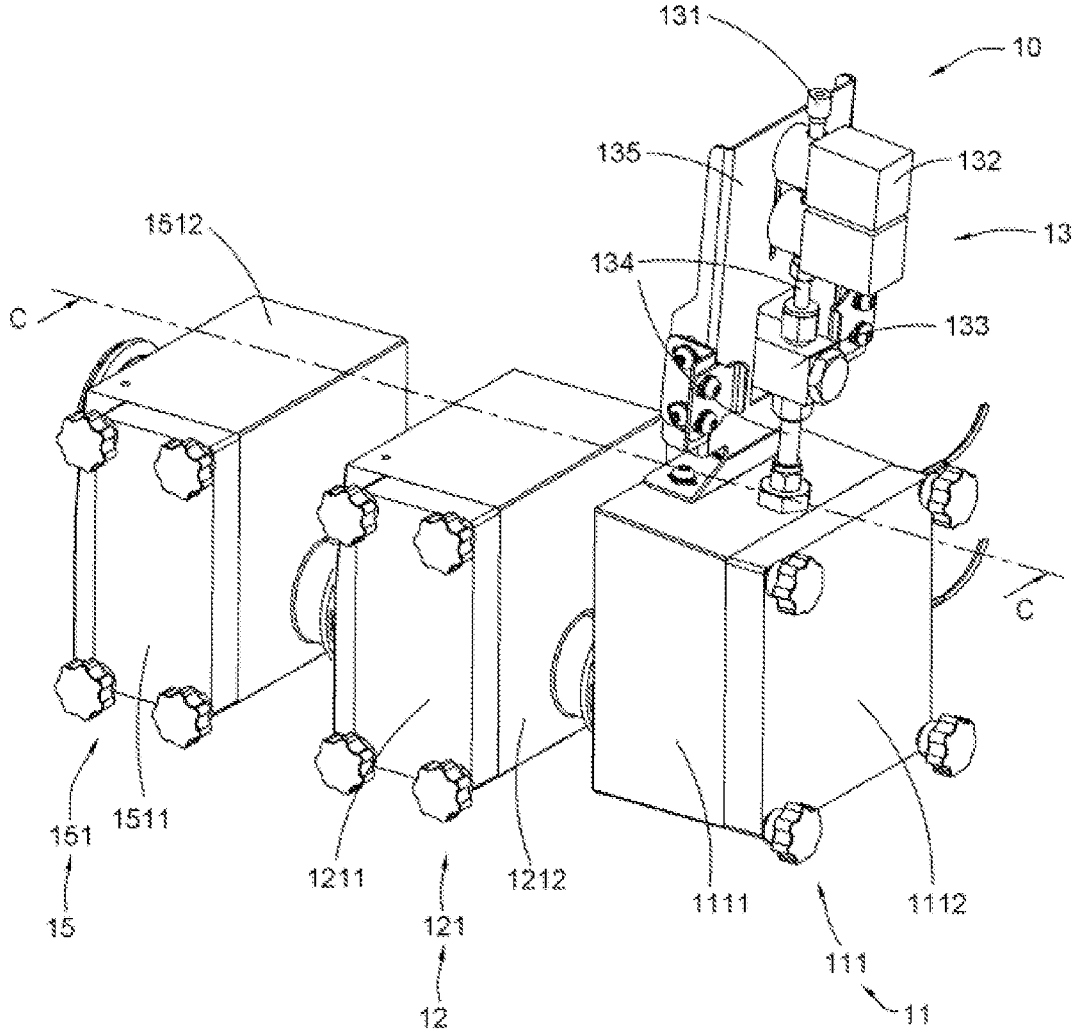
FIG. 8 is a schematic view of a raw material gasification device according to a third embodiment of the present disclosure.
Figure 9:
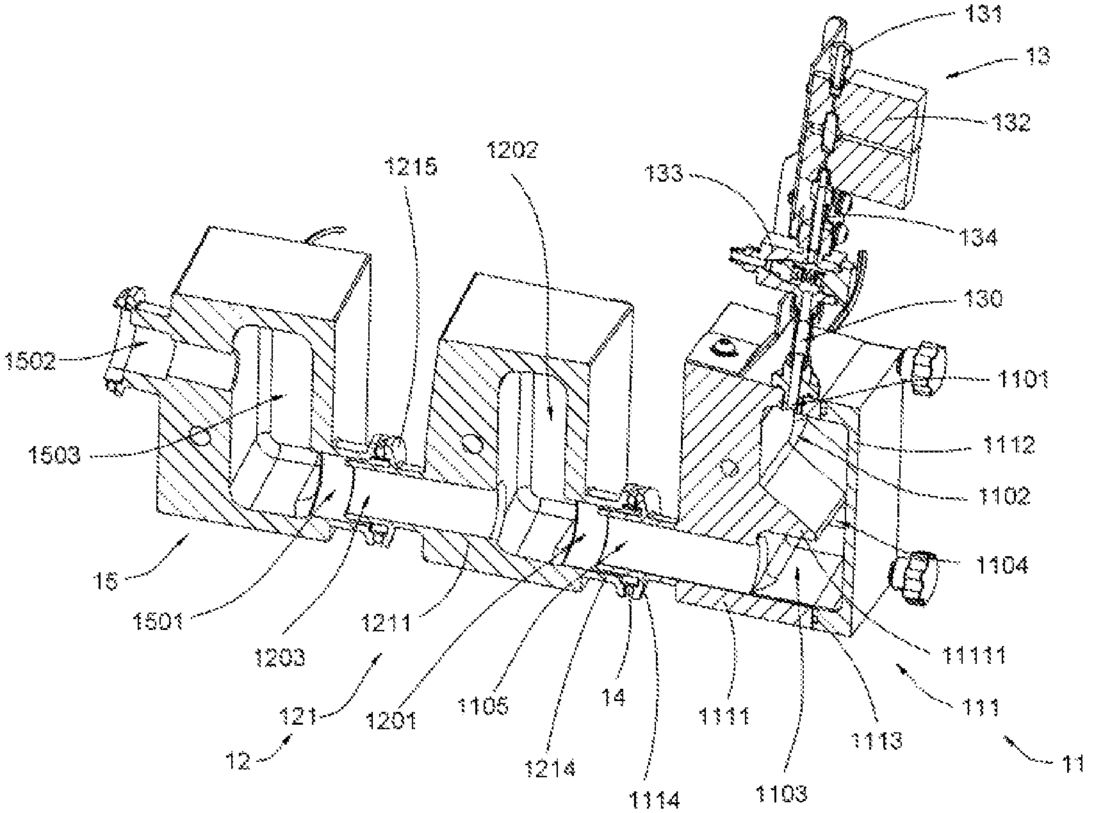
FIG. 9 is a cross-sectional view along line C-C in FIG. 8.
Figure 10A:
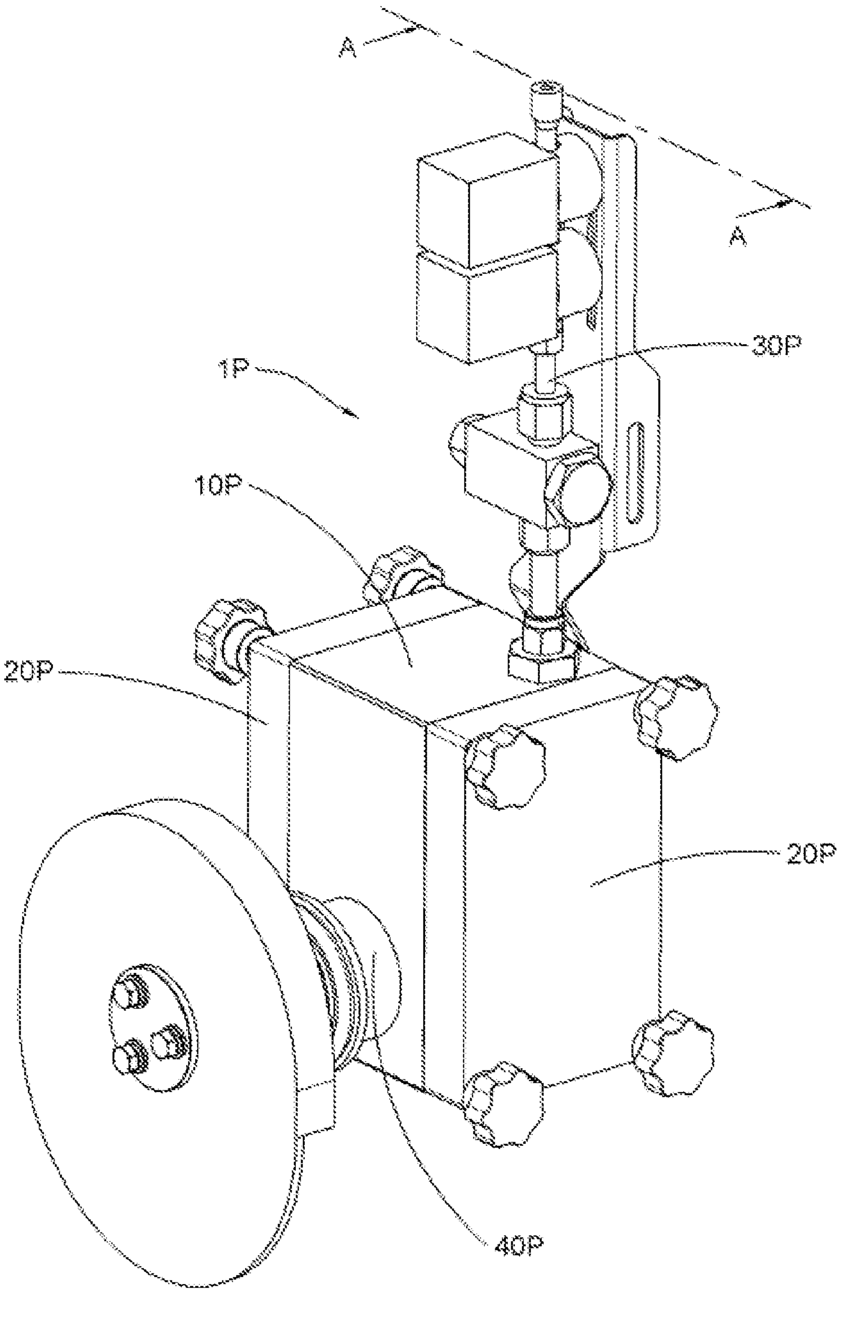
FIGS. 10A and 10B illustrate an example of an existing single feeding evaporator.
Figure 10B:
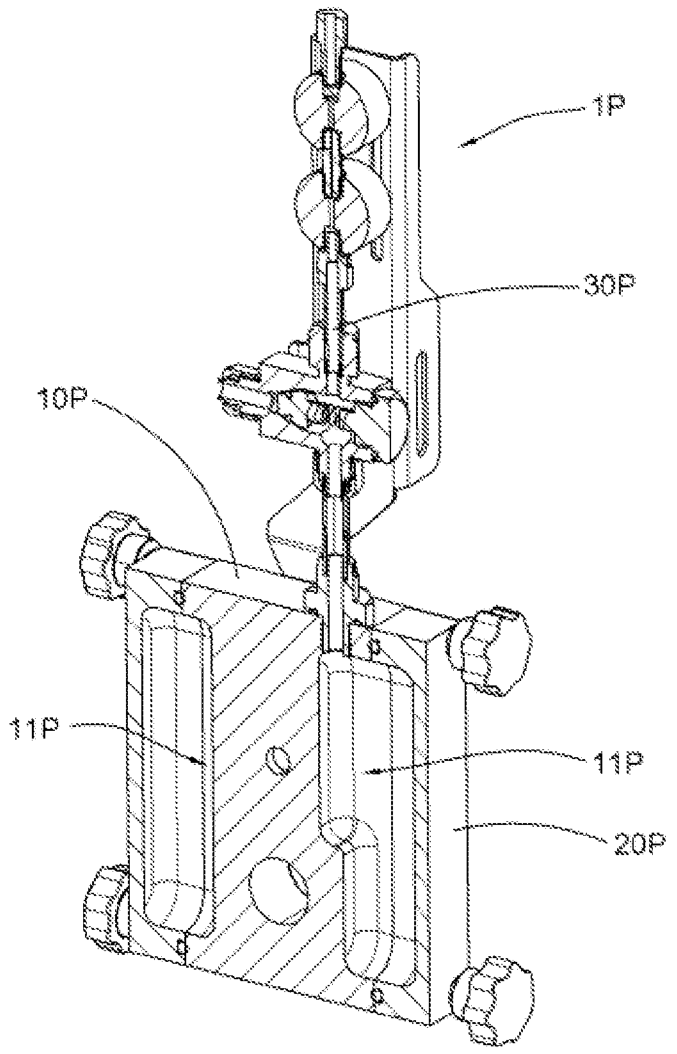

FIG. 8 is a schematic view of a raw material gasification device 10 according to a third embodiment of the present disclosure. FIG. 9 is a cross-sectional view of the raw material gasification device 10 according to the third embodiment of the present disclosure.

In some embodiments of the present disclosure, the raw material gasification device 10 also includes a third-stage gasification component 15 communicated with the second-stage gasification component 12. Certainly, in other embodiments of the present disclosure, more gasification components may be provided.

It should be noted that the third-stage gasification component 15 can be communicated with the second-stage gasification component 12 at a higher position, and also can be communicated with the second-stage gasification component 12 at a lower position. That is, an interface of the second-stage gasification component 12 can be adjusted according to the component to be connected.

More specifically, the third-stage gasification component 15 includes a third gasification box 151. The third gasification box 151 includes a third heating chamber 1503 communicated with the second outlet 1203 to further gasify the raw material gasified by the second gasification box 121.

The third gasification box 151 includes a third body 1511 and a third cover 1512, and the third cover 1512 is detachably connected to the third body 1511.

In some embodiments of the present disclosure, the third gasification box 151 has a third inlet 1501 at a lower position. Accordingly, the second outlet 1203 of the second gasification box 121 is located at a lower position. The third gasification box 151 has a third outlet 1502 at a higher position, that is, the position of the third outlet 1502 is higher than the position of the third inlet 1501.

The third gasification box 151 and the second gasification box 121 can also be connected with each other in a heat insulating manner through a heat insulating seal 14.

FIGS. 11 to 14 illustrate a secondary feeding evaporation device 91 according to a fourth embodiment of the present disclosure. The secondary feeding evaporation device 91 is suitable for assembling with a coating body 940 to form a film coating device, so that the film coating device can utilize the polymerization of a chemical monomer gas to form a polymer film on a surface of a workpiece to be coated.

Specifically, as shown in FIGS. 11 to 14, the secondary feeding evaporation device 91 includes an evaporator body 910 and a pipe component 920. The secondary feeding evaporation device can heat a chemical monomer liquid to evaporate into a chemical monomer gas through a heating device 930 for vacuum coating. The evaporator body 910 has a cavity 9101 and a heating installation component 9102. The cavity 9101 is used to receive the chemical monomer liquid, and the heating installation component 9102 is used to install the heating device 930, so that the heating device 930 heats the chemical monomer liquid in the cavity 9101, thus the chemical monomer liquid is evaporated into the chemical monomer gas. The pipe component 920 includes a first feed pipe 921, a second feed pipe 922 and a discharge pipe 923. The first feed pipe 921 and the second feed pipe 922 are respectively communicated with the cavity 9101 of the evaporator body 910 for feeding the chemical monomer liquid into the cavity 9101. The discharge pipe 923 is communicated with the cavity 9101 of the evaporator body 910 for discharging the evaporated chemical monomer gas from the cavity 9101.

It should be noted that since the secondary feeding evaporation device 91 of the present disclosure simultaneously includes the first feed pipe 921 and the second feed pipe 922 which are independent of each other. Compared with existing single feeding evaporator, the control range of the feeding flow of the secondary feeding evaporation device 91 of the present disclosure is greatly widened, which is twice or more than the feeding flow of the existing single feeding evaporator. In addition, the first feed pipe 921 and the second feed pipe 922 can be backup pipe for each other, so that when any one of the two pipes fails, the other feed pipe can still continue to deliver the chemical monomer liquid to the cavity 9101, which can ensure continuous normal operation of the vacuum coating process, and improve the working stability and reliability of the secondary feeding evaporation device 91.

In some embodiments, the first feed pipe 921 of the pipe component 920 can also be used to convey a process gas to the cavity 9101 before conveying the chemical monomer liquid to the cavity 9101 to replace the air in the cavity 9101, so as to prevent the chemical monomer liquid and/or the chemical monomer gas from directly contacting with the air in the cavity 9101 to cause chemical reaction or pollution, thereby ensuring that the chemical monomer gas has high purity and quality. It should be noted that the process gas of the present disclosure can include, but is not limited to, a gas that does not react with the chemical monomer gas, such as nitrogen, helium, neon or argon.

In other words, the first feed pipe 921 and/or the second feed pipe 922 of the pipe component 920 can not only be communicated with a chemical monomer storage tank (not shown in the figure) storing the chemical monomer liquid, so as to convey the chemical monomer liquid to the cavity 9101 through the first feed pipe 921 and/or the second feed pipe 922, but can also be communicated with a process gas storage tank (not shown in the figure) storing the process gas, so as to convey the process gas to the cavity 9101 through the first feed pipe 921 and/or the second feed pipe 922.

It should be noted that in FIGS. 11 to 14 and the following description, in order to illustrate the features and advantages of the secondary feeding evaporation device 91 of the present disclosure, the pipe component 920 of the secondary feeding evaporation device 91 includes only two feed pipes (that is, the first feed pipe 921 and the second feed pipe 922). It can be understood by those skilled in the art that, the specific number of the feed pipes disclosed in FIGS. 11 to 14 and the following description is only an example, which does not constitute a limitation on the content of the present disclosure. For example, in other examples of the secondary feeding evaporation device 91, more than two feed pipes can be provided, which can still achieve the evaporation effect of the secondary feeding evaporation device 91.

Figure 13A:
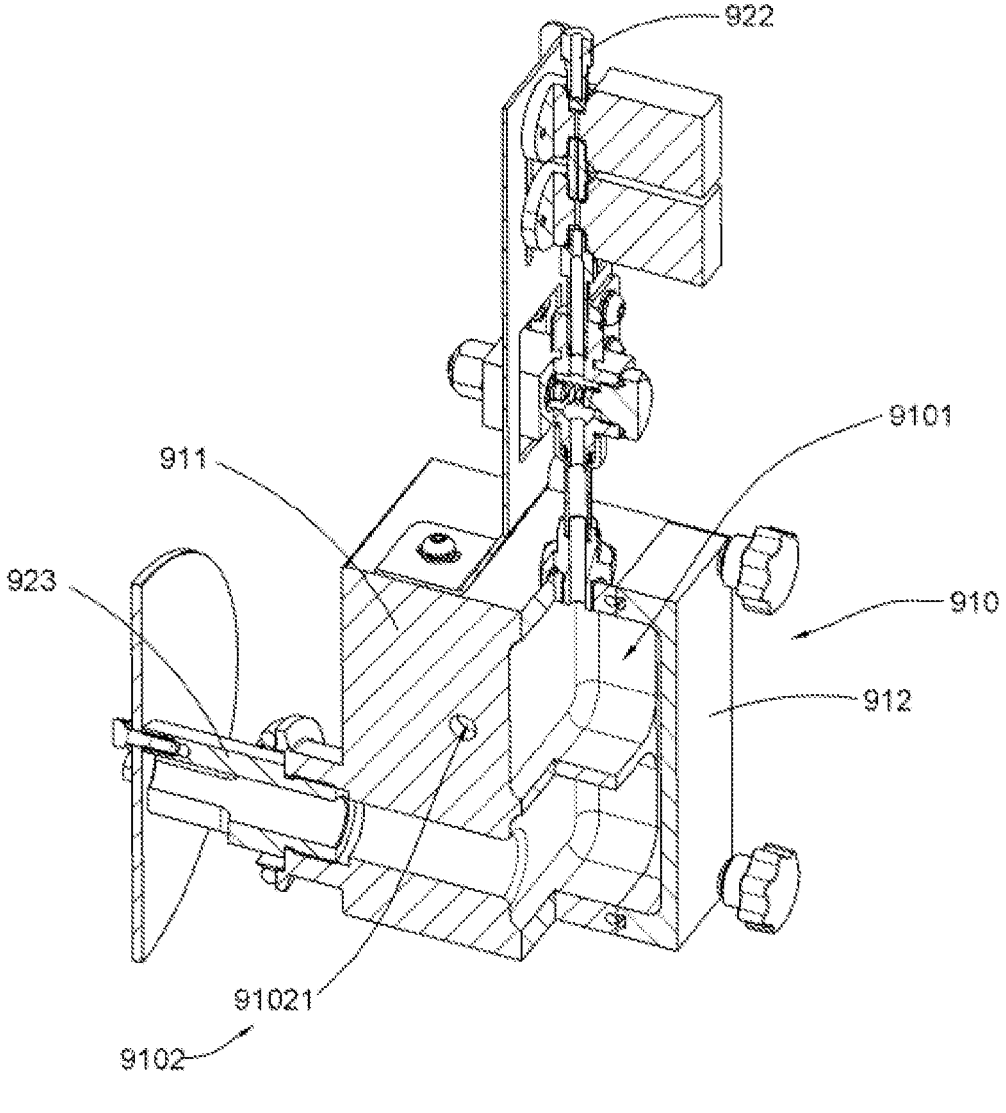
FIGS. 13A and 13B are cross-sectional views of the secondary feeding evaporation device according to the fourth embodiment of the present disclosure.
Figure 13B:
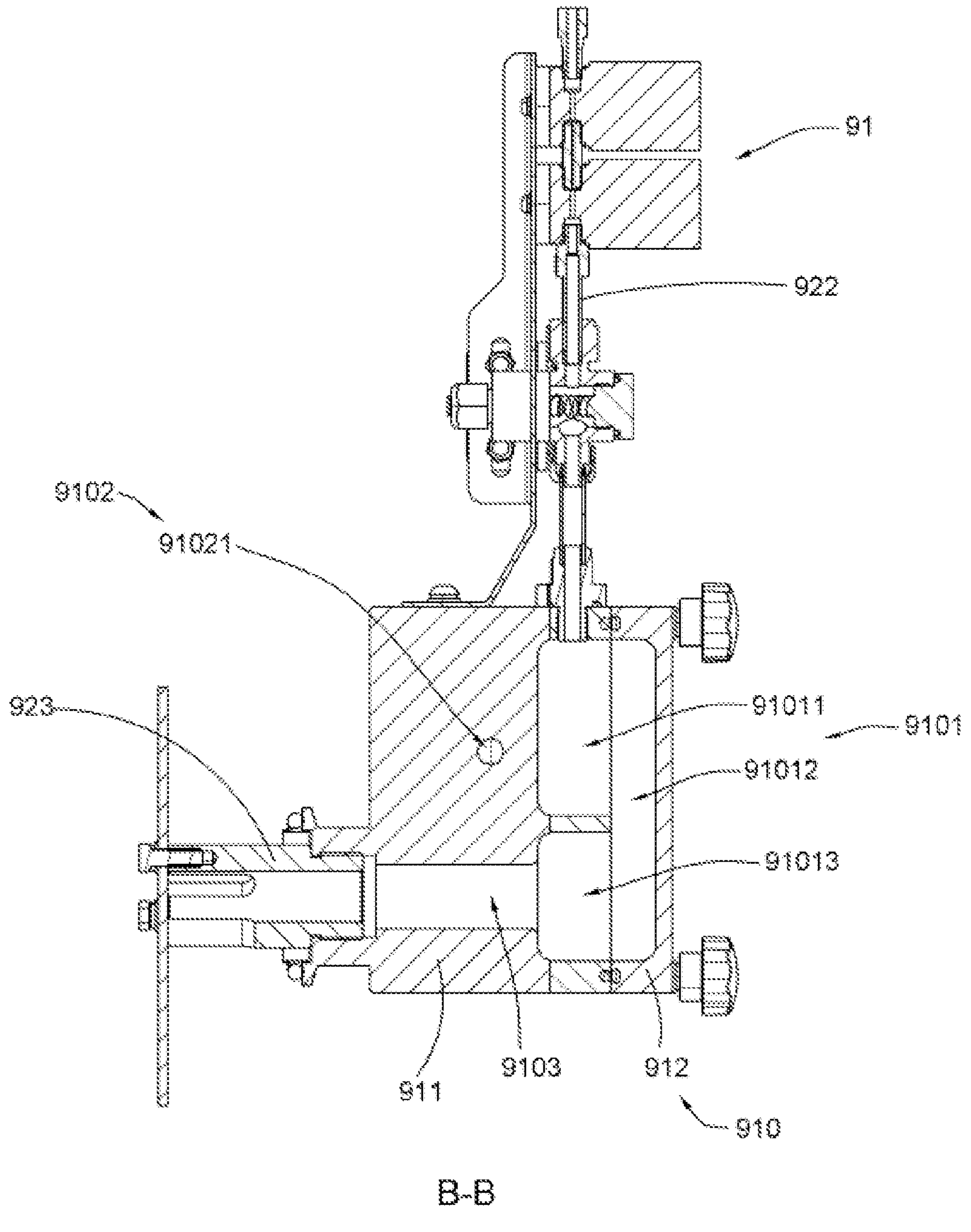

According to the above fourth embodiment of the present disclosure, more specifically, as shown in FIGS. 13A and 13B, the cavity 9101 of the evaporator body 910 of the secondary feeding evaporation device 91 includes a preheating chamber 91011 and an evaporating chamber 91012 which are communicated with each other. The first feed pipe 921 and the second feed pipe 922 are directly communicated with the preheating chamber 91011, so that the chemical monomer liquid conveyed through the first feed pipe 921 and/or the second feed pipe 922 first enters the preheating chamber 91011 to be preheated, and then enters the evaporating chamber 91012 to be evaporated to the chemical monomer gas. In other words, the secondary feeding evaporation device 91 can first preheat the chemical monomer liquid conveyed through the first feed pipe 921 and/or the second feed pipe 922, and then evaporate the preheated chemical monomer liquid to form the chemical monomer gas, which is helpful to improve the overall evaporation efficiency of the secondary feeding evaporation device 91.

In some embodiments, as shown in FIGS. 13A and 13B, the cavity 9101 of the evaporator body 910 further includes a heating chamber 91013 communicated with the evaporating chamber 91012. The discharge pipe 923 is communicated with the heating chamber 91013, so that the chemical monomer gas obtained by evaporation in the evaporating chamber 91012 can continue to be heated in the heating chamber 91013, and then enter the discharge pipe 923 for discharging, thus liquid drops carried in the chemical monomer gas can be evaporated, which is helpful to improve the dryness of the chemical monomer gas and further improve the evaporation efficiency of the secondary feeding evaporation device 91.

In some embodiments, as shown in FIG. 13B, the preheating chamber 91011 and the heating chamber 91013 in the evaporator body 910 are superposed and spaced from each other, and the evaporating chamber 91012 is located on the same side of the preheating chamber 91011 and the heating chamber 91013, so that the preheating chamber 91011 and the heating chamber 91013 are communicated with each other through the evaporating chamber 91012, which can prevent the preheating chamber 91011 and the heating chamber 91013 from being directly communicated with each other, and prevent the chemical monomer liquid preheated in the preheating chamber 91011 from entering the heating chamber 91013 without being evaporated in the evaporating chamber 91012, so as to prevent the chemical monomer liquid not evaporated from entering the discharge pipe 923 directly through the heating chamber 91013, and prevent insufficient dryness of the chemical monomer gas conveyed through the discharge pipe 923 and avoid affecting the subsequent vacuum coating process.

Figure 14:
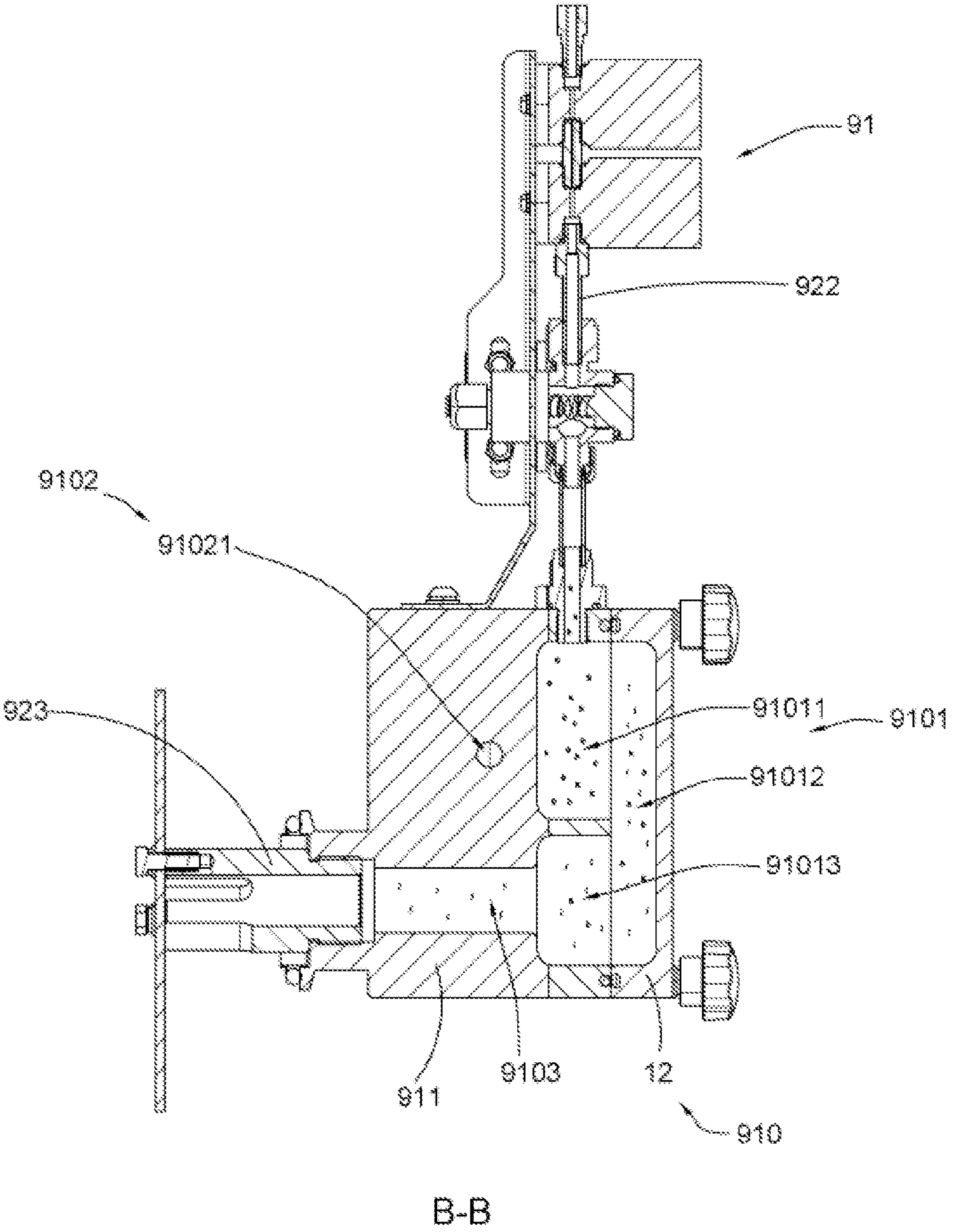
FIG. 14 is a schematic view illustrating the principle of the secondary feeding evaporation device according to the fourth embodiment of the present disclosure.

In some embodiments, as shown in FIGS. 13B and 14, the preheating chamber 91011 in the evaporator body 910 is located above the heating chamber 91013. The chemical monomer gas heated in the heating chamber 91013 rises in the evaporating chamber 91012, and the chemical monomer liquid preheated in the preheating chamber 91011 falls in the evaporating chamber 91012, thus the heated chemical monomer gas will meet the preheated chemical monomer liquid in the evaporating chamber 91012 to further heat the preheated chemical monomer liquid and improve the evaporation effect of the chemical monomer liquid in the evaporating chamber 91012.

According to the fourth embodiment of the present disclosure, as shown in FIGS. 13A and 13B, the evaporator body 910 of the secondary feeding evaporation device 91 includes a chamber body 911 and a cover 912. The cover 912 is detachably arranged on one side of the chamber body 911 to form the cavity 9101 between the chamber body 911 and the cover 912.

It should be noted that since the cover 912 is detachably installed in the chamber body 911, the cavity 9101 formed between the chamber body 911 and the cover 912 can be opened and closed, so the cavity 9101 of the secondary feeding evaporation device 91 is easy to be cleaned or maintained regularly or irregularly (such as cleaning the dirt on the inner wall of the cavity 9101), which can ensure the evaporation efficiency of the secondary feeding evaporation device 91, and enable the chemical monomer gas obtained by evaporation to maintain good purity and quality for a long time.

For example, as shown in FIGS. 13B and 14, the preheating chamber 91011 and the heating chamber 91013 in the evaporator body 910 of the secondary feeding evaporation device 91 are spaced from each other in the chamber body 911, and the evaporating chamber 91012 in the evaporator body 910 is correspondingly arranged in the cover 912, so that when the cover 912 is installed on the chamber body 911, the evaporating chamber 91012 is located on the same side of the preheating chamber 91011 and the heating chamber 91013, and communicates the preheating chamber 91011 with the heating chamber 91013 to form a complete cavity 9101, so as to first preheat the chemical monomer liquid, and then evaporate the chemical monomer liquid to obtain the chemical monomer gas, and finally further heat the chemical monomer gas to be discharged for the feeding evaporation process of vacuum coating.

In some embodiments, as shown in FIGS. 13A and 13B, the discharge pipe 923 and the cover 912 in the secondary feeding evaporation device 91 are respectively correspondingly arranged on two opposite sides of the chamber body 911. In this way, when the discharge pipe 923 of the secondary feeding evaporation device 91 is communicated with a vacuum coating body 940, the cover 912 of the secondary feeding evaporation device 91 will be located on the side of the chamber body 911 far from the vacuum coating body 940, so as to avoid the vacuum coating body 940 interfering with the disassembly of the cover 912. It can be understood that since the two covers of existing single feeding evaporator are respectively located on the left and right sides of the discharge pipe, when the discharge pipe of the existing single feeding evaporation device is connected to the vacuum coating body, the two covers of the existing single feeding evaporation device are still close to the vacuum coating body, causing the vacuum coating body to affect the disassembly and assembly of the two covers, which is not conducive to later maintenance and servicing.

In some embodiments, as shown in FIG. 13B, the evaporator body 910 of the secondary feeding evaporation device 91 can further have an air guide hole 9103. The air guide hole 9103 extends through the chamber body 911 so that the discharge pipe 923 is communicated with the heating chamber 91013 through the air guide hole 9103, and the chemical monomer gas heated in the heating chamber 91013 flows to the discharge pipe 923 through the chamber body 911 via the air guide hole 9103, and then is conveyed to the vacuum coating body 940 through the discharge pipe 923.

It should be noted that because the air guide hole 9103 penetrates through the chamber body 911, the chemical monomer gas guided by the air guide hole 9103 will also flows through the entire chamber body 911, so the chemical monomer gas can be continuously heated in the process of flowing through the air guide hole 9103, which can not only ensure liquid drops in the chemical monomer gas to be completely evaporated, but also prevent the chemical monomer gas from being liquefied due to temperature decreasing.

Figure 12:
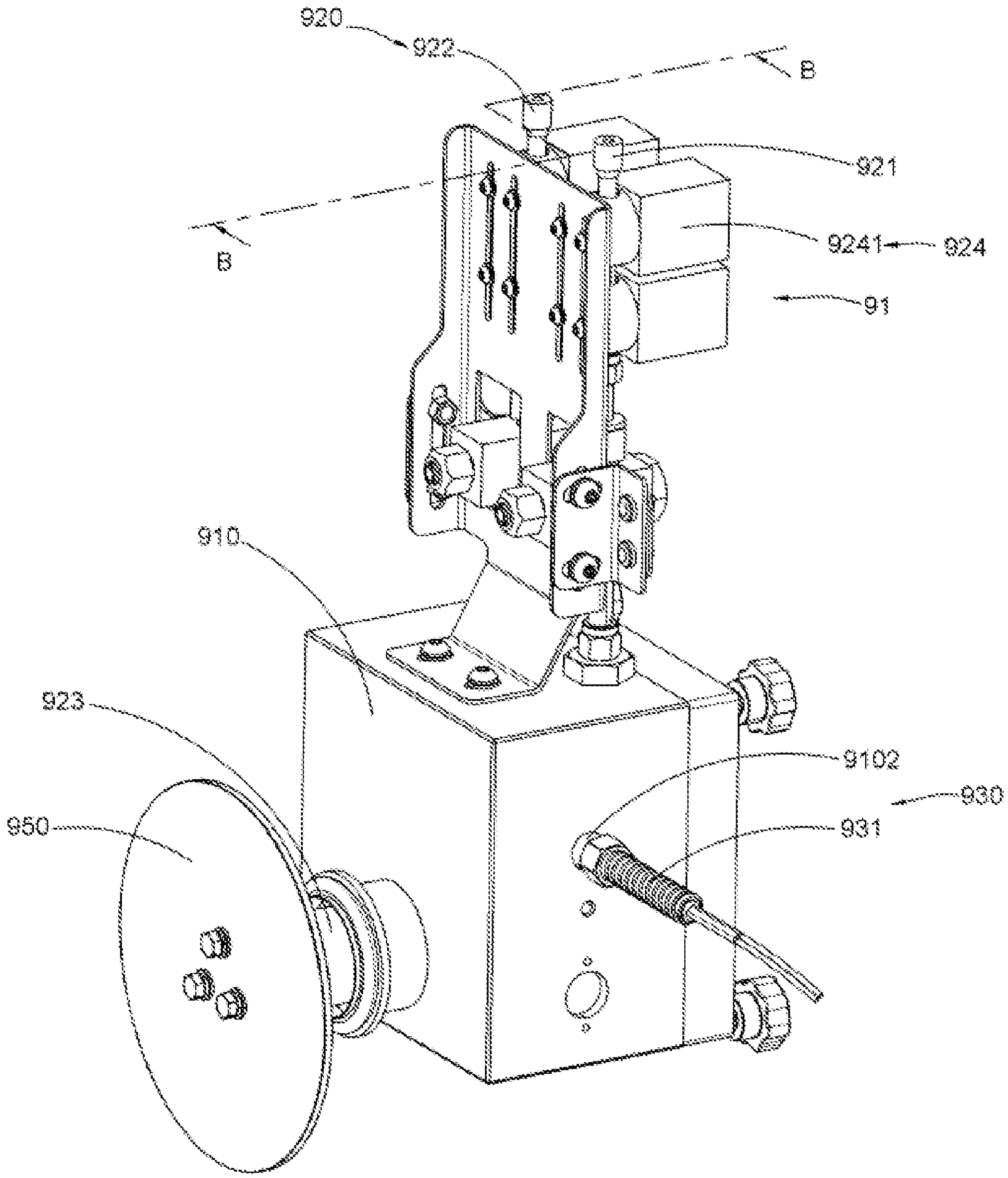
FIG. 12 is another schematic view of the secondary feeding evaporation device according to the fourth embodiment of the present disclosure.

It should be noted that in the above fourth embodiment of the present disclosure, as shown in FIGS. 12 and 13A, the heating device 930 is implemented as a heating rod 931, and correspondingly, the heating installation component 9102 of the evaporator body 910 is implemented as an insertion hole 91021. The insertion hole 91021 is arranged in the chamber body 911 for installing the heating rod 931 inserted into the insertion hole 91021, so as to realize corresponding preheating and/or heating effects by means of the heating rod 931.

In some embodiments, as shown in FIGS. 13A and 13B, the insertion hole 91021 in the evaporator body 910 is not communicated with the cavity 9101, so that the heat generated by the heating rod 931 is transferred to the cavity 9101 through the chamber body 911 for preheating and/or heating, which can better seal the cavity 9101 and prevent external air from entering the cavity 9101 through the insertion hole 91021 and affecting the evaporation efficiency and quality of the chemical monomer liquid in the cavity 9101. In other words, the heating rod 931 directly heats the chamber body 911, and then the heat is transferred to the cavity 9101 and the air guide hole 103 through the chamber body 911 to achieve corresponding preheating and/or heating purposes.

It can be understood that the heating device 930 (such as the heating rod 931) does not directly preheat and heat the chemical monomer liquid and the chemical monomer gas, but indirectly preheat and heat the chemical monomer liquid and the chemical monomer gas through the chamber body 911, which can increase heat transfer area between the heating device 930 and the chemical monomer liquid and the chemical monomer gas, and further improve the evaporation efficiency of the secondary feeding evaporation device 91.

It should be noted that according to the fourth embodiment of the present disclosure, as shown in FIG. 12, the pipe component 920 of the secondary feeding evaporation device 91 can further include a plurality of control valves 924. The plurality of control valves 924 are respectively correspondingly installed to the first feed pipe 921 and the second feed pipe 922 for respectively controlling the flow of the chemical monomer liquid conveyed through the first feed pipe 921 and the second feed pipe 922.

By way of example, the control valve 924 may include, but is not limited to, a diaphragm valve 9241. Certainly, in other examples of the present disclosure, the control valve 924 can also include other types of valves such as electric valve, solenoid valve or stop valve, which is not limited herein.

In addition, as shown in FIG. 12, the secondary feeding evaporation device 91 can further include a baffle 950. The baffle 950 is suitable to be detachably installed in the discharge pipe 923, so that when the discharge pipe 923 is communicated with the vacuum coating body 940, the baffle 950 is located inside the vacuum coating body 940 and adjacent to an inner wall of the cavity of the vacuum coating body 940 to change the flow direction of the chemical monomer gas, so that the chemical monomer gas diffuses in all directions, instead of flowing directly forward along an axial direction of the discharge pipe, so that the chemical monomer gas can be diffused more uniformly. In addition, the baffle 950 and the cover 912 fitted with fixing components such as bolts are respectively located on two opposite sides of the evaporator body 910 to facilitate the installation.

Figure 15:
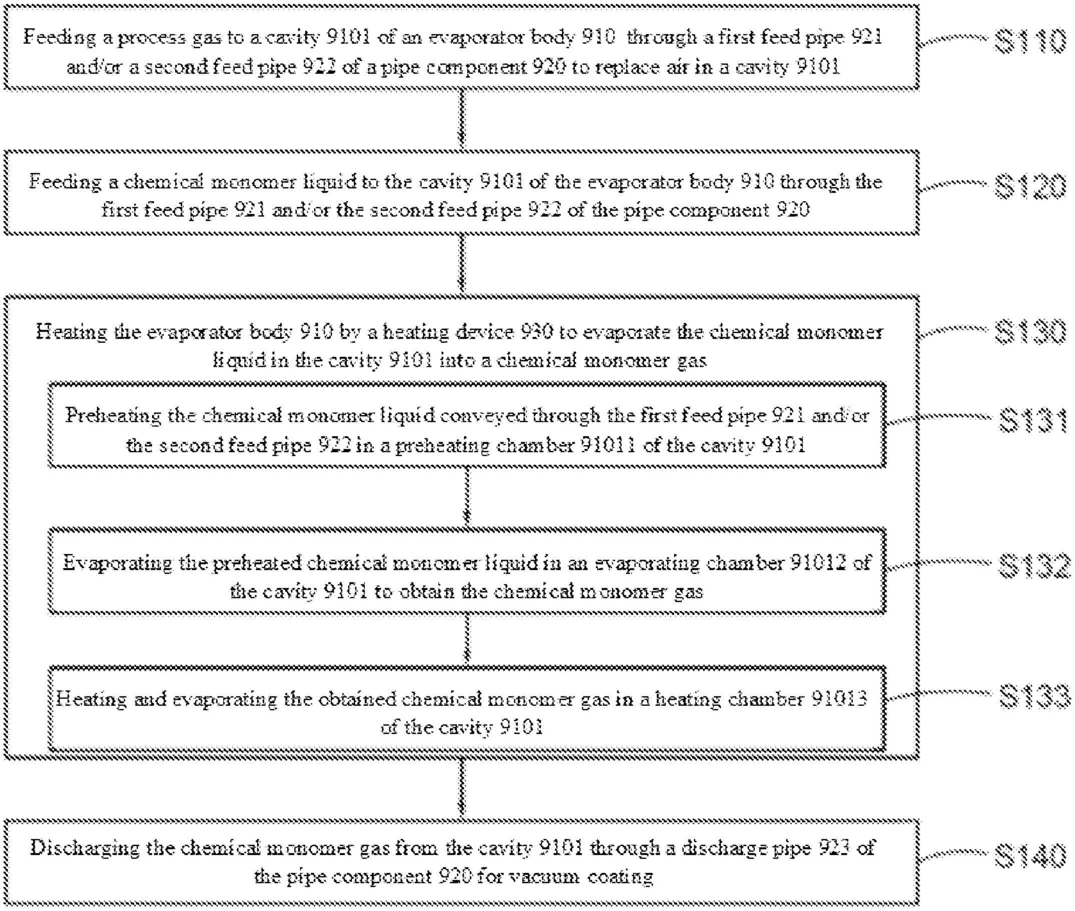
FIG. 15 is a schematic view illustrating a method of operating the secondary feeding evaporation device according to the fourth embodiment of the present disclosure.

According to another aspect of the present disclosure, as shown in FIG. 15, the present disclosure further provides a method for operating the secondary feeding evaporation device, including following steps:

S120: feeding the chemical monomer liquid to the cavity 9101 of the evaporator body 910 through the first feed pipe 921 and/or the second feed pipe 922 of the pipe component 920;

S130: heating the evaporator body 910 by the heating device 930 to evaporate the chemical monomer liquid in the cavity 9101 into the chemical monomer gas; and S140: discharging the chemical monomer gas from the cavity 9101 through the discharge pipe 923 of the pipe component 920 for vacuum coating.

It should be noted that the method of operating the secondary feeding evaporation device of the present disclosure can further include following steps:

S110: feeding the process gas to the cavity 9101 of the evaporator body 910 through the first feed pipe 921 and/or the second feed pipe 922 of the pipe component 920 to replace the air in the cavity 9101.

More specifically, as shown in FIG. 15, in the method of operating the secondary feeding evaporation device of the present disclosure, S130 may include following steps:

S131: preheating the chemical monomer liquid conveyed through the first feed pipe 921 and/or the second feed pipe 922 in the preheating chamber 91011 of the cavity 9101; and S132: evaporating the preheated chemical monomer liquid in the evaporating chamber 91012 of the cavity 9101 to obtain the chemical monomer gas.

In some embodiments, as shown in FIG. 15, S130 may further include following steps:

S133: heating and evaporating the obtained chemical monomer gas in the heating chamber 91013 of the cavity 9101.

Figure 11:
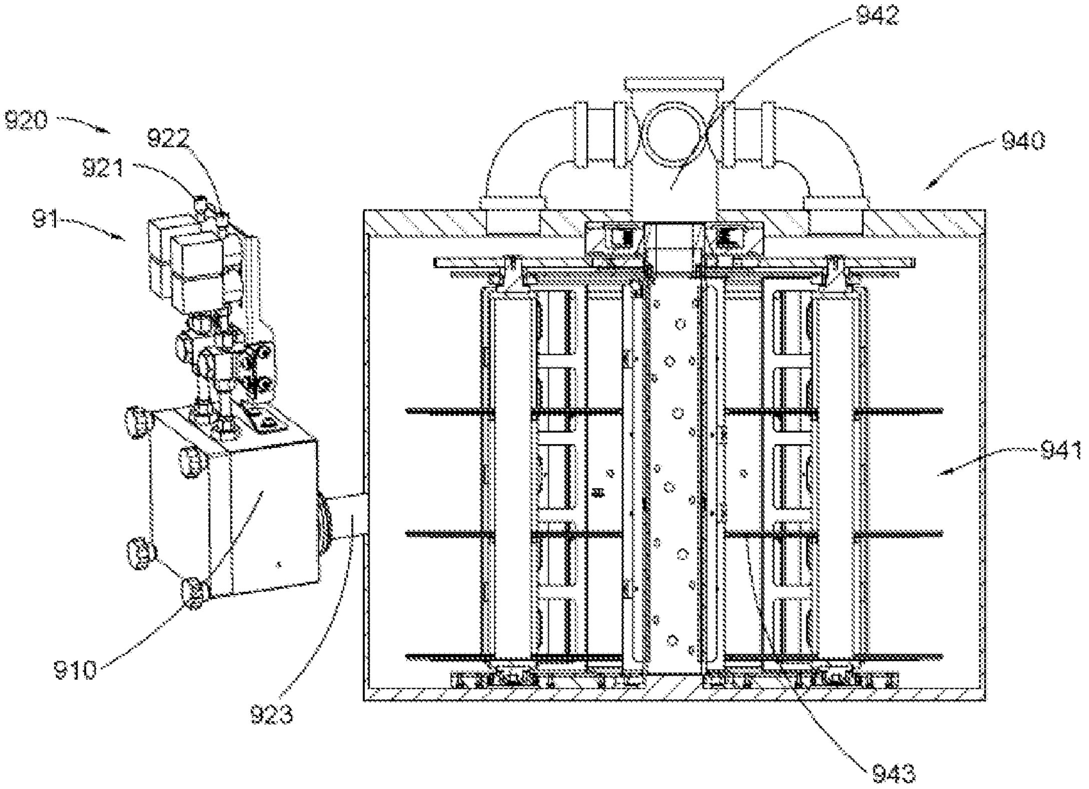
FIG. 11 is a schematic view of a secondary feeding evaporation device according to a fourth embodiment of the present disclosure.

According to another aspect of the present disclosure, as shown in FIG. 11, the present disclosure further provides a film coating device. The film coating device can include the secondary feeding evaporation device 91 and the coating body 940. The secondary feeding evaporation device 91 can be connected to the coating body 940 to provide the chemical monomer gas for the coating body 940 through the secondary feeding evaporation device 91 so as to perform the coating process through the coating body 940.

Specifically, as shown in FIG. 11, the coating body 940 can include a reaction cavity 941, a vacuum pumping pipe 942 and a bracket 943. The discharge pipe 923 of the secondary feeding evaporation device 91 is communicated with the reaction cavity 941 to supply the chemical monomer gas to the reaction cavity 941 through the secondary feeding evaporation device 91. The bracket 943 is arranged in the reaction cavity 941 for placing the workpiece to be coated, and the vacuum pumping pipe 942 is suitable for communicating the reaction cavity 941 with a vacuum pump to vacuum the reaction cavity 941 through the vacuum pump, so that the film coating device can form a polymer film layer on the surface of the workpiece to be coated by using the polymerization of the chemical monomer gas under the condition of vacuum pumping through the vacuum pump. It can be understood that the vacuum pumping mentioned herein refers to that an internal pressure of the reaction cavity 941 is less than an external pressure of the reaction cavity 941. Of course, the external pressure of the reaction cavity 941 can be atmospheric pressure or an air pressure lower or higher than atmospheric pressure, which is not limited herein.

More specifically, as shown in FIG. 11, the coating body 940 can further include an electrode element (not shown in the figure). The electrode element is arranged in the reaction cavity 941 for discharging the chemical monomer gas in the reaction cavity 941 to cause the chemical monomer gas to be polymerized and deposited on the surface of the workpiece to be coated.

It should be understood by those skilled in the art that, the embodiments of the present disclosure shown in the above description and the accompanying drawings are only examples and do not limit the present disclosure. The objects of the present disclosure have been fully and effectively achieved. The functional and structural principles of the present disclosure have been shown and explained in the embodiments, and any variations or modifications of the embodiments of the present disclosure are possible without departing from the principles.

The invention claimed is:

1. A raw material gasification device, comprising:

a first-stage gasification component for performing a primary gasification on a raw material;

a second-stage gasification component for performing a further gasification on the raw material after the primary gasification of the first-stage gasification component; and a feeding control component for feeding the raw material to be gasified, wherein the feeding control component is controllably communicated with the first-stage gasification component;

wherein the first-stage gasification component comprises a first gasification box, wherein the first gasification box has a preheating chamber and a first heating chamber, and the preheating chamber is only partially communicated with the first heating chamber, wherein the preheating chamber and the first heating chamber are arranged vertically in parallel, and the preheating chamber is arranged above the first heating chamber;

wherein the first gasification box has a first inlet communicated with the preheating chamber, and the feeding control component is connected with the first inlet, wherein the first gasification box has a partial communication channel, and the preheating chamber is communicated with the first heating chamber through the partial communication channel, wherein the first inlet and the partial communication channel are arranged in a staggered manner;

wherein the first gasification box has a first outlet communicated with the first heating chamber, and the first outlet is arranged opposite to the partial communication channel;

wherein the raw material entering the first inlet first enters the preheating chamber and then enters the first heating chamber through the partial communication channel.

2. The raw material gasification device according to claim 1, wherein a feeding direction of the feeding control component is in a vertical direction, and the first-stage gasification component and the second-stage gasification component are arranged in a horizontal direction.

3. The raw material gasification device according to claim 1, wherein the feeding control component comprises a first feed nozzle, a group of control valves and a group of feed pipes, wherein the first feed nozzle, the group of control valves and the group of feed pipes are controllably communicated to form a feeding channel through the group of control valves.

4. The raw material gasification device according to claim 3, wherein the feeding channel is in a vertical direction.

5. The raw material gasification device according to claim 3, wherein the group of control valves comprise a first control valve and a second control valve, wherein the first control valve is connected with the first feed nozzle, and the second control valve is connected with the first control valve through a feed pipe.

6. The raw material gasification device according to claim 5, wherein the first control valve is a diaphragm valve and the second control valve is a three-way valve.

7. The raw material gasification device according to claim 1, wherein the first-stage gasification component comprises a group of heating components, and the group of heating components comprise a preheating component and a first heating component, wherein the preheating component heats the preheating chamber, the first heating component heats the first heating chamber, and the preheating component and the first heating component perform heating independently.

8. The raw material gasification device according to claim 1, wherein a position of the first inlet is higher than a position of the first outlet.

9. The raw material gasification device according to claim 1, wherein the first gasification box comprises a first body and a first cover detachably connected to the first body, and the first cover and the first body are connected to form the preheating chamber and the first heating chamber.

10. The raw material gasification device according to claim 9, wherein the first gasification box comprises a first seal arranged at a position where the first cover and the first body are connected with each other.

11. The raw material gasification device according to claim 9, wherein the first body comprises a partition wall dividing an interior of the first body into two spaces.

12. The raw material gasification device according to claim 11, wherein the partial communication channel is formed between the first cover and a top of the partition wall.

13. The raw material gasification device according to claim 11, wherein the first inlet is arranged opposite to the partition wall.

14. The raw material gasification device according to claim 1, wherein the second-stage gasification component comprises a second gasification box, and the second gasification box has a second heating chamber and a second inlet, wherein the second inlet is communicated with the second heating chamber, and the second inlet is communicated with the first heating chamber.

15. The raw material gasification device according to claim 13, wherein the first gasification box has a first discharge nozzle, the second gasification box has a second feed nozzle, and the first discharge nozzle is extended to be connected to the second feed nozzle.

16. The raw material gasification device according to claim 15, wherein the first discharge nozzle extends into the second feed nozzle.

17. The raw material gasification device according to claim 14, wherein the raw material gasification device further comprises a heat insulating seal arranged at a position where the first gasification box is connected with the second gasification box.

18. The raw material gasification device according to claim 14, wherein the second-stage gasification component comprises a second heating component for heating the second gasification box.

19. The raw material gasification device according to claim 14, wherein the second gasification box has a second outlet, and a position of the second outlet is higher than a position of the second inlet.

20. The raw material gasification device according to claim 14, wherein the second gasification box comprises a second body and a second cover detachably connected to the second body.

* * * * *